(12) United States Patent
Schieffer, Jr. et al.

(10) Patent No.: US 9,097,974 B2
(45) Date of Patent: *Aug. 4, 2015

(54) METHOD FOR PREPARING A RELIEF PRINTING FORM

(71) Applicant: E I DU PONT DE NEMOURS AND COMPANY, Wilmington, DE (US)

(72) Inventors: Edmund Francis Schieffer, Jr., Wilmington, DE (US); Mark R. Mazur, West Chester, PA (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/771,310

(22) Filed: Feb. 20, 2013

(65) Prior Publication Data

US 2014/0057208 A1    Feb. 27, 2014

Related U.S. Application Data

(60) Provisional application No. 61/692,457, filed on Aug. 23, 2012.

(51) Int. Cl.
*G03F 7/00* (2006.01)
*G03F 7/20* (2006.01)

(52) U.S. Cl.
CPC .... *G03F 7/20* (2013.01); *G03F 7/202* (2013.01); *G03F 7/2014* (2013.01)

(58) Field of Classification Search
CPC ............ B41M 1/04; B41M 1/24; B41M 3/00; G03F 7/00; G03F 1/20; G03F 1/22; G03F 2009/0052
USPC ................................ 430/270.1, 306; 101/395
See application file for complete search history.

(56) References Cited

U.S. PATENT DOCUMENTS

| | | | |
|---|---|---|---|
| 2,760,863 A | 8/1956 | Plambeck, Jr. | |
| 2,927,024 A | 3/1960 | Woodward et al. | |
| 3,036,913 A | 5/1962 | Burg | |
| 3,060,023 A | 11/1962 | Burg et al. | |
| 3,144,331 A | 8/1964 | Thommes | |
| 3,264,103 A | 8/1966 | Cohen et al. | |

(Continued)

FOREIGN PATENT DOCUMENTS

| | | |
|---|---|---|
| DE | 3828551 A1 | 8/1990 |
| EP | 0 017 927 A2 | 4/1980 |

(Continued)

OTHER PUBLICATIONS

U.S. Appl. No. 12/791,382, filed Jun. 1, 2010, Rudolph.

(Continued)

*Primary Examiner* — Chanceity Robinson

(57) ABSTRACT

A relief printing form is prepared from a photosensitive element. An in-situ mask is formed and disposed above a photopolymerizable layer of the photosensitive element, the element is exposed to actinic radiation through the in-situ mask in an environment having an inert gas and a concentration of oxygen between about 30,000 ppm and about 7500 ppm to form at least a polymerized portion and an unpolymerized portion of the layer, and the exposed element is processed by treating with at least one washout solution selected from solvent solution, aqueous solution, semi-aqueous solution, or water.

15 Claims, 2 Drawing Sheets

(56) References Cited

U.S. PATENT DOCUMENTS

| | | |
|---|---|---|
| 3,796,602 A | 3/1974 | Briney et al. |
| 4,045,231 A | 8/1977 | Toda et al. |
| 4,177,074 A | 12/1979 | Proskow |
| 4,323,636 A | 4/1982 | Chen |
| 4,323,637 A | 4/1982 | Chen et al. |
| 4,427,759 A | 1/1984 | Gruetzmacher et al. |
| 4,430,417 A | 2/1984 | Heinz et al. |
| 4,431,723 A | 2/1984 | Proskow |
| 4,460,675 A | 7/1984 | Gruetzmacher et al. |
| 4,517,279 A | 5/1985 | Worns |
| 4,540,649 A | 9/1985 | Sakurai |
| 4,726,877 A | 2/1988 | Fryd et al. |
| 4,753,865 A | 6/1988 | Fryd et al. |
| 4,806,506 A | 2/1989 | Gibson, Jr. |
| 4,894,315 A | 1/1990 | Feinberg et al. |
| 4,942,111 A | 7/1990 | Wade et al. |
| 4,956,252 A | 9/1990 | Fryd et al. |
| 5,015,556 A | 5/1991 | Martens |
| 5,175,072 A | 12/1992 | Martens |
| 5,215,859 A | 6/1993 | Martens |
| 5,262,275 A | 11/1993 | Fan |
| 5,279,697 A | 1/1994 | Peterson et al. |
| 5,301,610 A | 4/1994 | McConnell |
| 5,330,882 A | 7/1994 | Kawaguchi et al. |
| 5,385,611 A | 1/1995 | Matsumoto et al. |
| 5,486,384 A | 1/1996 | Bastian et al. |
| 5,506,086 A | 4/1996 | Van Zoeren |
| 5,516,626 A | 5/1996 | Ohmi et al. |
| 5,562,039 A | 10/1996 | Fox et al. |
| 5,607,814 A | 3/1997 | Fan et al. |
| 5,645,974 A | 7/1997 | Ohta et al. |
| 5,654,125 A | 8/1997 | Fan et al. |
| 5,679,485 A | 10/1997 | Suzuki et al. |
| 5,688,633 A | 11/1997 | Leach |
| 5,705,310 A | 1/1998 | Van Zoeren |
| 5,707,773 A | 1/1998 | Grossman et al. |
| 5,719,009 A | 2/1998 | Fan |
| 5,760,880 A | 6/1998 | Fan et al. |
| 5,766,819 A | 6/1998 | Blanchet-Fincher |
| 5,771,809 A | 6/1998 | Hecht |
| 5,798,019 A | 8/1998 | Cushner et al. |
| 5,830,621 A | 11/1998 | Suzuki et al. |
| 5,840,463 A | 11/1998 | Blanchet-Fincher |
| 5,863,704 A | 1/1999 | Sakurai et al. |
| 5,888,701 A | 3/1999 | Fan |
| 6,037,102 A | 3/2000 | Loerzer et al. |
| 6,185,840 B1 | 2/2001 | Noelle et al. |
| 6,217,965 B1 | 4/2001 | Gelbart |
| 6,238,837 B1 | 5/2001 | Fan |
| 6,284,431 B1 | 9/2001 | Tanizaki et al. |
| 6,492,095 B2 * | 12/2002 | Samworth ............... 430/306 |
| 6,558,876 B1 | 5/2003 | Fan |
| 6,673,509 B1 | 1/2004 | Metzger |
| 6,766,740 B1 | 7/2004 | Wier |
| 6,773,859 B2 | 8/2004 | Fan et al. |
| 6,797,454 B1 | 9/2004 | Johnson et al. |
| 6,929,898 B2 | 8/2005 | Fan |
| 7,105,206 B1 | 9/2006 | Beck et al. |
| 7,348,123 B2 | 3/2008 | Mengel et al. |
| 7,399,575 B2 | 7/2008 | Takagi et al. |
| 8,236,479 B2 | 8/2012 | Rudolph |
| 2002/0115019 A1 | 8/2002 | Kaczun et al. |
| 2003/0211419 A1 | 11/2003 | Fan |
| 2004/0048199 A1 | 3/2004 | Schadebrodt et al. |
| 2004/0234886 A1 | 11/2004 | Rudolph et al. |
| 2004/0259033 A1 | 12/2004 | Kunita |
| 2005/0142480 A1 | 6/2005 | Bode et al. |
| 2005/0231708 A1 | 10/2005 | Sunagawa et al. |
| 2005/0266358 A1 | 12/2005 | Roberts et al. |
| 2006/0016355 A1 | 1/2006 | Saai et al. |
| 2006/0055761 A1 | 3/2006 | Daems et al. |
| 2006/0105268 A1 | 5/2006 | Vest |
| 2006/0144272 A1 | 7/2006 | Haraguchi et al. |
| 2008/0063979 A1 | 3/2008 | Tomita et al. |
| 2009/0186308 A1 | 7/2009 | Rudolph |
| 2009/0191482 A1 | 7/2009 | Rudolph et al. |
| 2009/0191483 A1 * | 7/2009 | Rudolph et al. ............... 430/306 |
| 2009/0245613 A1 | 10/2009 | Wu et al. |
| 2010/0143841 A1 * | 6/2010 | Stolt et al. ................. 430/270.1 |
| 2010/0218694 A1 | 9/2010 | Wier et al. |
| 2012/0060711 A1 | 3/2012 | Rudolph |
| 2013/0017493 A1 * | 1/2013 | Cook et al. ................... 430/306 |
| 2013/0216955 A1 * | 8/2013 | Schieffer et al. ............... 430/306 |

FOREIGN PATENT DOCUMENTS

| | | |
|---|---|---|
| EP | 0 741 330 A1 | 11/1996 |
| EP | 0 891 877 A2 | 1/1999 |
| EP | 0 945 753 A1 | 9/1999 |
| EP | 1 160 627 A2 | 12/2001 |
| EP | 1 457 823 A2 | 9/2004 |
| EP | 2 083 325 A2 | 1/2009 |
| EP | 2 085 820 A2 | 8/2009 |
| JP | 53-008655 A | 1/1978 |
| JP | 58-063939 | 4/1983 |
| JP | 03-239263 | 10/1991 |
| JP | 06-214377 | 8/1994 |
| JP | 2002/357907 | 12/2002 |
| JP | 2004/302447 | 10/2004 |
| JP | 2005/266467 | 9/2005 |
| JP | 2005/283778 A | 10/2005 |
| JP | 2005-316325 | 11/2005 |
| JP | 2006/130777 | 5/2006 |
| JP | 2007/086781 | 5/2007 |
| JP | 2007/519021 | 7/2007 |
| JP | 2009-058902 | 3/2009 |
| NL | 8 900 784 A | 3/1989 |
| WO | 92/21518 A1 | 12/1992 |
| WO | 2005/026836 A2 | 3/2005 |
| WO | 2008/034810 A2 | 3/2008 |
| WO | 2009/020496 A1 | 2/2009 |
| WO | 2009/033124 A2 | 3/2009 |
| WO | 2009/016974 A1 | 5/2009 |
| WO | 2011/002967 A1 | 1/2011 |

OTHER PUBLICATIONS

U.S. Appl. No. 13/320,831, filed Jul. 1, 2010, Rudolph.
U.S. Appl. No. 12/349,608, filed Sep. 1, 2007, Rudolph.
U.S. Appl. No. 13/527,771, filed Jun. 20, 2012, Rudolph.
U.S. Appl. No. 12/356,752, filed Aug. 3, 2011, Rudolph et al.
U.S. Appl. No. 13/493,004, filed Jun. 11, 2012, Rudolph et al.
U.S. Appl. No. 13/527,936, filed Jun. 20, 2012, Rudolph et al.
U.S. Appl. No. 12/401,106, filed Mar. 10, 2009, Rudolph et al.
U.S. Appl. No. 61/692,457, filed Aug. 12, 2012, Schieffer et al.
U.S. Appl. No. 13/593,092, filed Feb. 20, 2013, filed Schieffer, Jr. et al.

B. Taylor, R. Fan, G. Blanchet, "The Digital Difference", FLEXO™ Magazine, Jul. 1997.

Flexography: Principles and Practice, Ronkonkoma, New York—4$^{th}$ Edition and 5$^{th}$ Edition, 1999 (Book Not Included).

Flexography: Principles and Practice, Ronkonkoma, New York—4th Edition and 5th Edition, 1999, Chapters 8-12, pp. 103-379, (Chapter 8, pp. 103-147; Chapter 9, pp. 149-177; Chapter 10, pp. 181-288; Chapter 11, pp. 289-318; Chapter 12, pp. 319-376.

Charles R. Morgan and David R. Kyle, UV Generated Oxygen Scavengers and Method for Determining Their Effectiveness in Photopolymerizable Systems, Journal of Radiation Curing, Oct. 1983, pp. 4-7.

Dr. A.R. Kannurpatti and Dr. B.K. Taylor, Taming Photopolymerization, The Platemaker's Role in Controlling the Process, Product Trend Report, Flexographic Technical Association, FLEXO, Nov. 2001.

Takashi Odajima, Honggi Bae, Tadashi Kawamoto, Yuichi Nakajima, and Yoshikazu Matsumoto, Abstract of WO 2009/016974 A1, Nakan Corporation, Feb. 5, 2009.

(56) References Cited

OTHER PUBLICATIONS

Search Report, PCT/US2012/052075, dated Nov. 30, 2012.
Search Report, Application No. 09151324.2-1226/2085820, dated Aug. 20, 2009.
Search Report, PCT/US2010/040723, dated Sep. 27, 2010.
Search Report, Application No. 09151051.1-2222/2083325, dated Dec. 10, 2009.
Search Report, PCT/US2013/026984, dated May 2, 2013.

* cited by examiner

METHOD FOR PREPARING A RELIEF PRINTING FORM

BACKGROUND OF THE INVENTION

1. Field of the Disclosure

This invention pertains to a method for preparing a relief printing form from a photosensitive element, and in particular, to a method of preparing the relief printing form by imagewise exposing the photosensitive element in a specific environment, and then treating with a washout solution.

2. Description of Related Art

Flexographic printing plates are widely used for printing of packaging materials ranging from corrugated carton boxes to cardboard boxes and to continuous web of plastic films. Flexographic printing plates are used in relief printing in which ink is carried from a raised-image surface and transferred to a substrate. Flexographic printing plates can be prepared from photopolymerizable compositions, such as those described in U.S. Pat. Nos. 4,323,637 and 4,427,759. Photosensitive elements generally have a solid layer of the photopolymerizable composition interposed between a support and a coversheet or a multilayer cover element. Flexographic printing plates are characterized by their ability to crosslink or cure upon exposure to actinic radiation. The plate is imagewise exposed with actinic radiation through an image-bearing art-work or a template, such as a photographic negative or transparency (e.g., silver halide films) for so called analog workflow, or through an in-situ mask having radiation opaque areas that had been previously formed above the photopolymerizable layer for so called digital workflow. The actinic radiation exposure is typically conducted with ultraviolet (UV) radiation. The actinic radiation enters the photosensitive element through the clear areas and is blocked from entering the black or opaque areas of the transparency or in-situ mask. The areas of the photopolymerizable layer that were exposed to the actinic radiation crosslink and harden and/or become insoluble to solvents used during development. The unexposed areas of the photopolymerizable layer that were under the opaque regions of the transparency or the in-situ mask during exposure do not hardened and/or remain soluble. The unexposed areas are removed by treating with a washout solution or heat leaving a relief image suitable for printing. If treated with washout solution, the plate is dried. Although thermal treatment to remove unexposed areas from the layer of the photopolymerizable material advantageously avoids time consuming drying step, washout treatment with solution is a well-accepted commercial practice in the industry to form the relief surface for the printing form. After all desired processing steps, the plate is then mounted on a cylinder and used for printing.

Solid plate preparation workflows involve making an intermediate, i.e., the photographic negative or phototool. Analog workflow requires the preparation of the phototool, which is a complicated, costly and time-consuming process requiring separate processing equipment and chemical development solutions. In addition, the phototool may change slightly in dimension due to changes in temperature and humidity. The same phototool, when used at different times or in different environments, may give different results. Use of a phototool also requires special care and handling when fabricating flexographic printing forms to ensure intimate contact is maintained between the phototool and plate. In particular, care is required in the placement of both the phototool and the plate in the exposure apparatus along with special materials to minimize air entrapment during creation of a vacuum to ensure intimate contact. Additionally care must be taken to ensure all surfaces of the photopolymer plate and phototool are clean and free of dust and dirt. Presence of such foreign matter can cause lack of intimate contact between the phototool and plate as well as image artifacts.

An alternative to analog workflow is termed digital workflow, which does not require the preparation of a separate phototool. Photosensitive elements suitable for use as the precursor and processes capable of forming an in-situ mask in digital workflow are described in U.S. Pat. No. 5,262,275; U.S. Pat. No. 5,719,009; U.S. Pat. No. 5,607,814; U.S. Pat. No. 6,238,837; U.S. Pat. No. 6,558,876; U.S. Pat. No. 6,929,898; U.S. Pat. No. 6,673,509; U.S. Pat. No. 5,607,814; U.S. Pat. No. 6,037,102; and U.S. Pat. No. 6,284,431. The precursor or an assemblage with the precursor includes a layer sensitive to laser radiation, typically infrared laser radiation, and opaque to actinic radiation. The infrared-sensitive layer is imagewise exposed with laser radiation whereby the infrared-sensitive material is removed from, or transferred onto/from a superposed film of the assemblage, to form the in-situ mask having radiation opaque areas and clear areas adjacent the photopolymerizable layer. The precursor is exposed through the in-situ mask to actinic radiation in the presence of atmospheric oxygen (since no vacuum is needed). Furthermore, due in part to the presence of atmospheric oxygen during imagewise exposure the flexographic printing form has a relief structure that is different from the relief structure formed in analog workflow (based upon the same size mask openings in both workflows). Digital workflow creates a raised element (i.e., dot or line) in the relief structure having a surface area of its uppermost surface (i.e., printing surface) that is significantly less than the opening in the in-situ mask corresponding to the relief structure. Digital workflow results in the relief image having a different structure for dots (i.e., raised surface elements) that is typically smaller, with a rounded top, and a curved sidewall profile, often referred to as dot sharpening effect. Dots produced by analog workflow are typically conical and have a flat-top. The relief structure formed by digital workflow results in positive printing properties such as, finer printed highlight dots fading into white, increased range of printable tones, and sharp linework. As such, the digital workflow because of its ease of use and desirable print performance has gained wide acceptance as a desired method by which to produce the flexographic printing form. But not all end-use applications view this dot-sharpening effect as beneficial.

It is known by those skilled in the art that the presence of oxygen ($O_2$) during exposure in free-radical photopolymerization processes will induce a side reaction in which the free radical molecules react with the oxygen, while the primary reaction between reactive monomer molecules occurs. This side reaction is known as inhibition (i.e., oxygen inhibition) as it slows down the polymerization or formation of crosslinked molecules. Many prior disclosures acknowledge that it is desirable for photopolymerization exposure to actinic radiation to occur in air (as is the case for digital workflow), under vacuum (as is the case for analog workflow), or in an inert environment. Oftentimes, nitrogen is mentioned as a suitable inert gas for the inert environment. The implication is that the nitrogen environment is one that contains substantially less than atmospheric oxygen to the extent that all oxygen is removed, or something less than about 10 ppm of oxygen. Nitrogen with oxygen impurity concentration level less than 10 ppm is readily commercially available.

The effect of oxygen associated with digital workflow can impact the ability to hold solid screen patterns in solid printing areas of the relief printing form. It is often desirable for an image that is printed by flexographic relief printing form to increase the density of ink in solid areas of the image, so-called solid ink density. Solid screening is a well-known process for improving the solid ink density in flexographic printing, and is described for instance in U.S. Pat. No. 6,492, 095; and U.S. Patent Publication US 2010/0143841. Solid screening consists of creating a pattern in the solid printing areas which is small enough that the pattern is not reproduced in the printing process (i.e., printed image), and large enough that the pattern is substantially different from the normal, i.e., unscreened, printing surface. Often these screening patterns are features in the range of 5 to 30 microns. The inhibition effect of the atmospheric oxygen during imagewise exposure of a photosensitive element for relief printing can result in pattern features being reduced in size by about 15 microns on each edge. Consequently this reduction in feature size, a 30 micron feature will be reduced to a 0 micron feature size for example, limits relief printing form to print increased solid ink densities.

There is a desire to provide printing forms with a relief structure that can hold microcell patterns in solid areas and having relief features similar to analog, that is, raised features that are conically shaped and have a flat-top or substantially flat-top surface, including fine raised printing features of about 5 to 30 microns, such as highlight halftone dots and lines. Each of raised print features of the relief surface includes a top surface area which is the ink carrying surface, a side-wall surface area, and a shoulder surface area which is the transition between the top surface area and the side-wall surface area. For each raised feature the total printing area capable of contacting the substrate to transfer the ink is the sum of the top surface area and the shoulder surface area. For high quality printing, it is desirable that the shoulder surface area does not or only minimally contributes with the top surface area in contacting the substrate to transfer the ink. The contribution of the shoulder surface area to the total print area of a particular raised feature can also be influenced by pressure between the substrate and the relief print form during printing. As such, the shoulder surface of raised features should sharply transition from the top surface to the side-wall surface since obtuse or broad transitioning shoulder surfaces readily tend to print. Relief printing forms that have fine features with broad shoulder surface area can result in poor print performance, that is, poor reproduction of the image printed on the substrate. Poor reproduction of printed images can be problematic particularly for printed images that are the combination of fine raised lines and reverses, such as bar codes that are electronically scanned for the contained information. In some instances, printing the shoulder surface area with the top surface area can be further exacerbated by the orientation of the image on the printing form relative to the print direction particularly in rotary printing, i.e., relative to the longitudinal axis of the print cylinder.

It is desirable to eliminate the costs and the time consuming and process steps associated with the preparation of the photographic negative intermediate and transition from analog workflow to digital workflow in the fabrication of solid plates, while avoiding the dot-sharpening effect of the relief features associated with conventional digital exposure in the presence of atmospheric oxygen to create relief features having an analog-like appearance. For high quality printing, the relief printing form should have a relief surface is capable of printing detailed fine highlights in halftone images and/or clean fine text and line graphics without broadening of the shoulder area, and capable of holding solid screen patterning in solid areas for printing solid ink areas with increased density.

So a need arises for a method of fabricating a relief printing form from a photosensitive precursor element that utilizes a digital-like workflow for its ease and simplicity while utilizing washout development that results in the printing form having a relief structure with features necessary for high quality printing.

SUMMARY OF THE INVENTION

In accordance with this invention there is provided a method for preparing a relief printing form from a photosensitive element, including the steps of (a) forming an in-situ mask disposed above a layer of a photopolymerizable composition in the photosensitive element, wherein the photopolymerizable composition comprises a binder, an ethylenically unsaturated compound and a photoinitiator; (b) exposing the photopolymerizable layer to actinic radiation through the mask in an environment having an inert gas and a concentration of oxygen between 30,000 ppm and 7500 ppm, forming at least a polymerized portion and at least an unpolymerized portion; and, (c) treating the exposed element by processing in a washout solution selected from solvent solution, aqueous solution, semi-aqueous solution, or water.

BRIEF DESCRIPTION OF THE DRAWINGS

The invention can be more fully understood from the following detailed description thereof in connection with the accompanying drawing described as follows:

FIG. 1 is a reproduction of a micrograph taken of a print sample of a 150 micron positive line printed by a 45DPR plate prepared as described above, wherein the line of the in-situ mask was imaged along a circumference of a drum of a digital imager, and printed such that the orientation of the line was parallel to the print direction of the rotary print cylinder.

FIG. 2 is a reproduction of a micrograph taken of a print sample of a 150 micron positive line printed by a 45DPR plate prepared as described above, wherein the line of the in-situ mask was imaged perpendicular to a circumference of a drum (i.e., parallel to axis of drum) of a digital imager, and printed such that the orientation of the line was perpendicular to the print direction of the rotary print cylinder.

FIG. 3 is a reproduction of a micrograph taken of a print sample of a 150 micron positive line printed by a 45DPN plate prepared as described above, wherein the line of the in-situ mask was imaged along a circumference of a drum of a digital imager, and printed such that the orientation of the line was parallel to the print direction of the rotary print cylinder.

FIG. 4 is a reproduction of a micrograph taken of a print sample of a 150 micron positive line printed by a 45DPN plate prepared as described above, wherein the line of the in-situ mask was imaged perpendicular to a circumference of a drum (i.e., parallel to axis of drum) of a digital imager, and printed such that the orientation of the line was perpendicular to the print direction of the rotary print cylinder.

DESCRIPTION OF THE PREFERRED EMBODIMENTS

Figure 1:
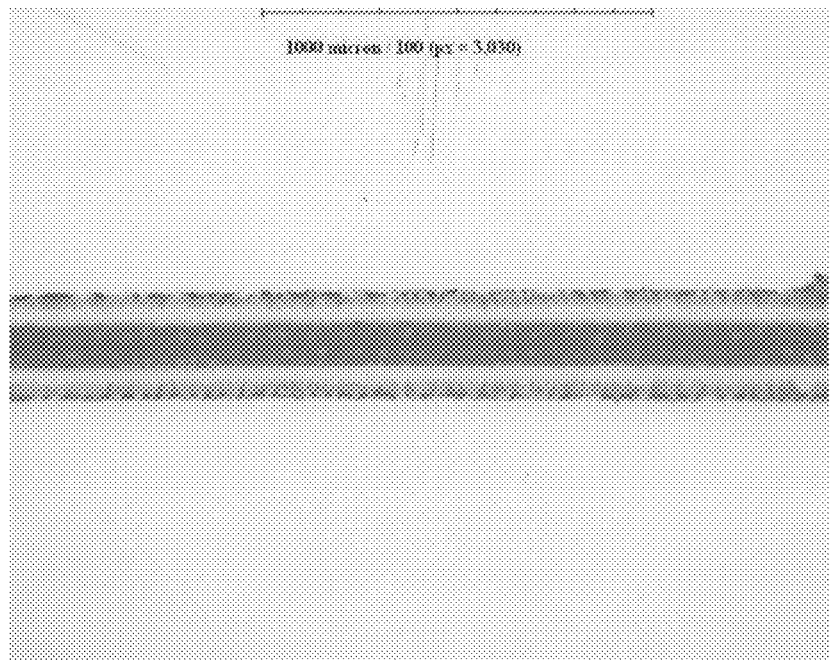
FIG. 1 through FIG. 4 are reproductions of micrographs taken of a print sample containing 150 micron line on a substrate that was printed by portions of a printing plates (45DPN and 45 DPR), wherein the printing plate was prepared by ablating with infrared laser radiation a radiation-opaque layer to form an in-situ mask, imagewise exposing a photosensitive element to actinic radiation through the mask in an environment containing nitrogen and 0.5% oxygen concentration, and treating solvent washout as described in Example 2.

Throughout the following detailed description, similar reference characters refer to similar elements in all figures of the drawings.

The present invention is a method for preparing a printing form from a photosensitive element, and in particular to a method for forming a relief printing form from the photosensitive element. In most embodiments the printing form includes a relief pattern that is particularly suited for relief printing, including use as a flexographic printing form and letterpress printing form. Relief printing is a method of printing in which the printing form prints from an image area, where the image area of the printing form is raised and the non-image area is depressed. In some embodiments, the printing form is suited for gravure or gravure-like printing. Gravure printing is a method of printing in which the printing form prints from an image area, where the image area is depressed and consists of small recessed cups or wells to contain the ink or printing material, and the non-image area is the surface of the form. Gravure-like printing is similar to gravure printing except that a relief printing form is used wherein the image area is depressed and consists of recesses areas forming wells to carry the ink which transfer during printing. The method prepares a printing form with a relief structure composed of recessed areas and raised areas for forming patterns of printing regions on a substrate that contain detailed fine highlights in halftone images, clean open areas between the raised areas and recessed areas, and clean fine text and line-graphics. Also, the method prepares a relief printing form that is capable of holding solid screen patterning of fine features in solid areas for printing solid ink areas with increased density. The relief printing form is prepared from a photosensitive precursor element that utilizes digital like workflow to eliminate the costly and problematic creation of a separate intermediate, and utilizes washout development to prepare the printing form.

It has surprisingly and unexpectedly been found that a relief printing form having both raised printing surfaces of sufficient structure and without loss of screen patterning in solid areas can be achieved with a digital workflow-like process (i.e., modified digital workflow) in which the photosensitive element is imagewise exposed in an environment having an inert gas and a concentration of oxygen less than atmospheric but greater than a completely inert gas environment, that is in particular, in an environment having an inert gas and a concentration of oxygen between about 30,000 and about 7500 parts per million (ppm), and washout development. The present method provides the capability to create solid screen patterning, i.e., microscreen pattern, in the uppermost surface (i.e., printing surface) of the solid printing areas on the printing form having features in the range of about 5 to about 30 micron (micrometer); and creates in some embodiments well-structured fine raised printing features of about 15 to 30 micron, and in other embodiments well-structured fine raised printing features of about 5 to 30 micron, such as highlight halftone dots and lines. The present method provides the printing form with the raised printing surfaces composed of raised surface elements, in which each raised surface element is well-characterized by its conical shape and has a flat or substantially flat top surface area, with a sharp or substantially sharp transition from the flat top surface area to the side-wall surface area to accurately reproduce the desired image on the substrate. No longer is the relief structure in a relief printing form fabricated by digital workflow limited by oxygen inhibition effect on the photopolymerizable layer.

The present invention provides for the capability to create the relief surface of the raised surface elements on the printing form that essentially is the recreation of the ire-situ mask image, particularly in terms of size of openings in mask relative to the size of the raise surface element (e.g., halftone dot). The present invention avoids the cost and production disadvantages associated with analog workflow, and capitalizes on the efficiencies of digital workflow while avoiding the difficulty of establishing and maintaining a completely inert environment.

A method for providing a relief printing form from a photosensitive element includes forming an in-situ mask adjacent to a layer of a photopolymerizable composition of the photosensitive element, exposing the photopolymerizable layer of the photosensitive element to actinic radiation through the in-situ mask in an environment having an inert gas and a concentration of oxygen between 30,000 and 7500 parts per million (ppm) forming a polymerized portion and an unpolymerized portion, and washout treating the exposed element. In some embodiments, the unpolymerized portion is removed to form the relief printing form to provide recessed areas and form a pattern of raised areas of polymerized material for printing. The photosensitive element includes a layer of a photopolymerizable composition composed of at least a binder, an ethylenically unsaturated compound, and a photoinitiator. In most embodiments the photopolymerizable layer is on or adjacent to a support. The photosensitive element for use in the present invention is not limited, provided that the photosensitive element is capable of having an in-situ mask disposed above the photopolymerizable layer, that is, an in-situ mask on or adjacent the photopolymerizable layer. The in-situ mask is an image or pattern of opaque areas and transparent areas that is integral or substantially integral with the photosensitive element for imagewise exposure to actinic radiation, and does not need vacuum to assure contact of the mask to the photopolymerizable layer. The in-situ mask avoids the drawbacks associated with generating a separate phototool and using vacuum to assure contact of the phototool to the photosensitive layer when making the relief printing form.

The method includes forming an in-situ mask adjacent to the photopolymerizable layer. In most embodiments, the in-situ mask, or simply mask, has a plurality of openings through an area opaque to actinic radiation disposed above the photopolymerizable layer. The in-situ mask image is disposed above the photopolymerizable layer when the mask is formed on or adjacent the surface of the photopolymerizable layer that is opposite a side of the photopolymerizable layer having the support. The mask includes a pattern of opaque areas and openings of transparent or "clear" areas, which is the graphic information that is to be printed by the print form. The opaque areas of the mask prevent the photopolymerizable material beneath from being exposed to the radiation (i.e., actinic radiation opaque areas) and hence those areas of the photopolymerizable layer covered by the dark areas do not polymerize, i.e., unpolymerized portions. The "clear" areas of the mask expose the photopolymerizable layer to actinic radiation and polymerize or crosslink the underlying portions of the photopolymerizable layer. The clear areas of the mask form the plurality of openings through an area opaque to actinic radiation. The mask associated with the photosensitive element ultimately creates a pattern of relief structure of the photopolymerizable layer, in which the relief structure includes the raised surfaces of the well-structured, fine, raised surface elements that are the printing surface areas for a relief printing form.

Further, in some embodiments, the mask includes in the clear or open areas a pattern of a plurality of features in which each feature has a dimension between about 5 and about 30 micron that is opaque or substantially opaque to actinic radiation. In some embodiments, the actinic radiation opaque features are spaced from each other (center-to-center) at dimensions from about 5 to about 30 microns. This pattern of actinic radiation opaque features is sometimes referred to as a microcell pattern. The pattern of plurality of actinic radiation opaque features is not limited, and need not be a regular or repeatable pattern. The microcell patterning is associated with software for the laser imaging devices that form the in-situ mask. In most embodiments, a microcell pattern is induced into printing surface area of the print form that will print solid ink areas. Advantageously, the present method can reproduce the microcell pattern of plurality of features as a plurality of recessed areas on the printing surface area of the printing form that prints continuous or substantially continuous area of ink on the substrate, so-called solid areas, to provide desired density of solid ink coverage.

The method by which the in-situ mask is formed with an actinic radiation opaque material is not limited. The in-situ mask can be generated by any suitable method, including digital direct-to-plate methods using laser radiation (often referred to as digital methods or digital workflow), and inkjet application, that is conducted prior to imagewise exposure of the photosensitive element to actinic radiation. The actinic radiation opaque layer is employed in digital direct-to-plate image technology in which laser radiation, typically infrared laser radiation, is used to form a mask of the image for the photosensitive element (instead of the conventional image transparency or phototool). Generally, digital methods of in-situ mask formation use laser radiation to either selectively remove or transfer a radiation opaque material, from or to a surface of the photosensitive element opposite the support. Digital methods of creating the mask image require one or more steps to prepare the photosensitive element prior to imagewise exposure. In most embodiments the method is used to print graphic information or images, which can include text features, line features, and halftone illustrations. For halftone illustrations the openings created in the mask typically have a dot area that can range from 2 to 99%. The dot area for each of the raised surface elements of the raised printing areas will vary according to the requirements of the graphic image being printed. In most embodiments, the plurality of openings in the in-situ mask has a line screen resolution of less than 250 lines per inch (lpi) so that graphic images with desired highlight dot resolution can be printed. Typical line screen resolution used for creating halftone images for relief printing forms includes, but is not limited to, 120 lpi, 133 lpi, 150 lpi, and 171 lpi.

In one embodiment, the photosensitive element initially includes an actinic radiation opaque layer disposed on or above a surface of the photopolymerizable layer opposite the support, and laser radiation imagewise removes, i.e., ablates or vaporizes, the radiation opaque layer to form the in-situ mask. Only the portions of the radiation opaque layer that were not removed from the photosensitive element will remain on the element to create the mask.

In another embodiment, the photosensitive element will not initially include the actinic radiation opaque layer. A separate element bearing the radiation opaque layer will form an assemblage with the photosensitive element such that the radiation opaque layer is adjacent the surface of the photosensitive element opposite the support. The assemblage is exposed imagewise with laser radiation to selectively transfer or selectively alter the adhesion balance of the radiation opaque layer and form the mask image on or disposed above the photopolymerizable layer. In this embodiment, only the transferred portions of the radiation opaque layer reside on the photosensitive element forming the in-situ mask.

It is contemplated that digital mask formation could also be accomplished by imagewise application of the radiation opaque material in the form of inkjet inks on the photosensitive element. Imagewise application of ink-jet ink can be directly on the photopolymerizable layer or disposed above the photopolymerizable layer on another layer of the photosensitive element.

Another contemplated embodiment for forming the in-situ mask is by creating the mask image of the radiation opaque layer on a separate carrier. In some embodiments, the separate carrier includes a radiation opaque layer that is imagewise exposed to laser radiation to selectively remove the radiation opaque material and form the image. The mask image on the carrier is then transferred with application of heat and/or pressure to the surface of the photopolymerizable layer opposite the support. The photopolymerizable layer is typically tacky and will retain the transferred image. The separate carrier can then be removed from the element prior to imagewise exposure.

In some embodiments, the laser radiation used to form the mask is infrared laser radiation. The infrared laser exposure can be carried out using various types of infrared lasers, which emit in the range 750 to 20,000 nm. Infrared lasers including diode lasers emitting in the range 780 to 2,000 nm and Nd-YAG lasers emitting at 1064 nm are preferred. A preferred apparatus and method for infrared laser exposure to imagewise remove the actinic radiation opaque layer from the photosensitive element is disclosed by Fan at al. in U.S. Pat. Nos. 5,760,880 and 5,654,125. The in situ mask image remains on the photosensitive element for the subsequent step of overall exposure to actinic radiation.

The next step of the method to prepare a relief printing form is to overall expose the photosensitive element to actinic radiation through the in-situ mask, that is, imagewise exposure of the element. Imagewise exposure of the photosensitive element to actinic radiation is conducted in an environment that includes the presence of an inert gas and an oxygen concentration of about 30,000 to about 7500 part per million (ppm). The inert gas is a gas that exhibits no or a low reaction rate with the photosensitive element (that is, inert to the polymerization reaction), and is capable of displacing oxygen in the exposure environment. Suitable inert gases include, but are not limited to, argon, helium, neon, krypton, xenon, nitrogen, carbon dioxide, and combinations thereof. In one embodiment, the inert gas is nitrogen.

Imagewise exposure of the photosensitive element to actinic radiation can be conducted in an environment that includes the presence of an inert gas and an oxygen concentration between, and optionally including, any two of the following values: 30,000; 25,000; 20,000; 15,000; 14,000; 13,000; 12,000; 11,000; 10,000; 9,500; 9,000; 8,500; 8,000; and 7,500 ppm. In some embodiments, imagewise exposure of the photosensitive element to actinic radiation is conducted in an environment that includes the presence of an inert gas and an oxygen concentration of about 30,000 to about 7500 ppm (about 3% to about 0.75%). In some embodiments, imagewise exposure of the photosensitive element to actinic radiation is conducted in an environment that includes the presence of an inert gas and an oxygen concentration of about 30,000 to about 10,000 ppm. In some embodiments, imagewise exposure of the photosensitive element to actinic radiation is conducted in an environment that includes the presence of an inert gas and an oxygen concentration of about 25,000 to about 7500 ppm. In some embodiments, imagewise exposure of the photosensitive element to actinic radiation is conducted in an environment that includes the presence of an inert gas and an oxygen concentration of 20,000 to about 7500 ppm. In some embodiments, imagewise exposure of the photosensitive element to actinic radiation is conducted in an environment that includes the presence of an inert gas and an oxygen concentration of about 15,000 to about 7500 ppm.

Imagewise exposure of the photosensitive element to actinic radiation in the particular environment of inert gas and oxygen concentration between about 30,000 and about 7500 parts per million (ppm) (about 3% to about 0.75%) creates in the printing form (after washout treatment) a relief structure of a plurality of raised surface elements each having a ink carrying top surface area that is structurally more similar to an ink carrying top surface area created in a printing form that can be prepared with analog workflow. That is, the top surface area of the raised surface elements in the relief printing form prepared according to the present method is flatter or substantially flat, and not as rounded as is typical of conventional digital workflow wherein the element is exposed in the presence of atmospheric oxygen. Further, imagewise exposure of the photosensitive element through the in-situ mask in an environment with the presence of an inert gas and oxygen concentration between about 30,000 and 7500 ppm provides for the capability to create raised surface printing elements having a relatively sharp transition from the flat top print surface area to the side-wall surface area. Imagewise exposure of the photosensitive element in environments having an inert gas and a concentration of oxygen less than about 7500 ppm, can create a relief printing form having suitable raised surface elements that are substantially conically shaped and have a flat-top or substantially flat-top print surface, but fine raised printing features such as highlight halftone dots and lines of about 15 to about 30 micron tend to have broadened shoulder areas between the flat top print surface and the side-wall surface. In some embodiments, the fine raised printing features such as highlight halftone dots and lines of about 5 to about 30 micron tend to have broadened shoulder areas between the flat top print surface and the side-wall surface. These broadened shoulder surface areas can contribute with the top surface area in contacting the substrate to transfer the ink during printing. In some instances, printing the shoulder surface area with the top surface area can be further exacerbated by the orientation of the image on the printing form relative to the print direction particularly in rotary printing, i.e., relative to the longitudinal axis of the print cylinder. That is, in some embodiments the images printed by relief plate prepared in an environment containing an inert gas and a concentration of oxygen less than about 7500 ppm, appear excessively distorted and/or larger on the substrate than desired (from the mask image) when fine line elements of the images of the printing form are oriented parallel to the axis of the print cylinder. The formation of shoulders may also be influenced by the quality of in-situ mask formed on the precursor, including for example, orientation of the lines during imaging to form the in-situ mask with laser radiation on a drum of the laser imager. In most embodiments, lines of the in-situ mask that are imaged along the circumference provide better quality shoulders compared to lines of the in-situ mask that are imaged parallel to the drum axis (i.e., perpendicular to the circumference of the drum).

Imagewise exposure of the photosensitive element in environments having an inert gas and a concentration of oxygen greater than about 30,000 ppm, creates a relief printing form having adequate removal of unpolymerized material from recessed area's, but small features, e.g., less than about 20 micron, such as recessed areas formed by microcell patterning in solid areas, may not be fully defined or formed. In this case, the recessed areas of microcell patterning are larger than the original mask image and can increase to such an extent that they essentially overlap eliminating space between the recessed areas, such that the features of the microcell patterning detail is lost or obscured. This most typically results in decrease in density of the ink in printed solid areas. Imagewise exposure of the photosensitive element through the in-situ mask in the presence of an inert gas and oxygen concentration between 30,000 and 7500 ppm can also faithfully reproduce or substantially reproduce the fine features of a screen pattern in solid areas of the relief to achieve desired increased ink density and/or other desirable print improvements. Imagewise exposure of the photosensitive element through the in-situ mask in the presence of an inert gas and oxygen concentration between 30,000 and 7500 ppm enables the use of digital workflow for mask creation yet counters the dot-sharpening effect caused by oxygen inhibition. Conventional digital workflow methods imagewise expose the photosensitive element to actinic radiation in air, which is 78% nitrogen, ~21% oxygen, <1% each argon and carbon dioxide, and trace amounts of other gases. In one embodiment, the photosensitive element does not include any additional layers on top of the in-situ mask, which additional layers may act as a barrier to the environment to the surface being imagewise exposed.

In one embodiment, the photosensitive element can be placed in an enclosure or chamber that is transparent to actinic radiation and adapted for placement on a bed of an exposure unit. One such embodiment of the enclosure is described in U.S. Patent Application Publication US 2009/0191483. In one embodiment, the enclosure can be sealed from external environment (room conditions) and includes an inlet port for introducing the inert gas into the enclosure and an outlet port for purging the air that is initially in the enclosure. A meter for measuring the concentration of oxygen within the enclosure may be located at the exit port.

In some embodiments, after the oxygen concentration has reached about 30,000 ppm or less in the enclosure, imagewise exposure is initiated and the oxygen concentration in the enclosure is continually reduced during imagewise exposure by continuous introduction of the inert gas into the enclosure. In some embodiments, imagewise exposure can begin when the concentration of oxygen is about at or below 30,000 ppm (3%), and continue as the oxygen concentration is reduced to about 7500 ppm (0.75%). In other embodiments after the oxygen concentration has reached between 30,000 ppm and 7500 ppm in the enclosure, imagewise exposure is initiated and the oxygen concentration in the environment in the enclosure is maintained or substantially maintained by continuously purging with a combination of the inert gas and oxygen at the desired concentration for the entirety of the exposure. In some embodiments, the environment for the photosensitive element during exposure has a concentration of oxygen that is an average of the oxygen concentration at the start of the imagewise exposure and the oxygen concentration at the end of the imagewise exposure, where the average oxygen concentration is between about 30,000 ppm and about 7500 ppm. In some other embodiments, the environment for the photosensitive element during imagewise exposure has a concentration of oxygen that is a weighted average of the oxygen concentration based on the percentage of time of the total exposure time, where the weighted average oxygen concentration is between about 30,000 ppm and about 7500 ppm.

The oxygen concentration range between and optionally including any two of the values as stated above represents an approximate oxygen concentration, as indicated by the use of the term "about" prior to any two values of a particular range. The oxygen concentration range of about a high value of the range to about a low value of the range can represent an actual range of oxygen concentration that is in some embodiments, plus or minus (±) 10%; in other embodiments plus or minus (±) 5%; and in yet other embodiments plus or minus (±) 2% of each of the high value and of the low value of the range.

For instance, the oxygen concentration range from "about 30,000 ppm to about 7500 ppm" is an oxygen concentration of 30,000 to 7500 ppm or is an oxygen concentration of substantially 30,000 to 7500 ppm. The oxygen concentration range from "about 30,000 ppm to about 7500 ppm" can represent, in some embodiments, an oxygen concentration of 30,000 ppm plus or minus (±) 10% to 7500 ppm plus or minus (±) 10%. In other embodiments, the oxygen concentration range from "about 30,000 ppm to about 7500 ppm" can represent an oxygen concentration of 30,000 ppm plus or minus (±) 5% to 7500 ppm plus or minus (±) 5%. In yet other embodiments, the oxygen concentration range from "about 30,000 ppm to about 7500 ppm" can represent an oxygen concentration of 30,000 ppm plus or minus (±) 2% to 7500 ppm plus or minus (±) 2%. An oxygen concentration range of about a high value of the range to about a low value of the range, e.g., 30,000 ppm to about 7500 ppm, takes into consideration the accuracy of the exposure equipment components and measurement devices, along with other factors, such as the particular photopolymer composition, that may influence the printing form resulting from the present method to have the desired dot shape, small or fine feature formation, and removal of unpolymerized material.

The photosensitive element of the present invention is exposed through the in-situ mask to actinic radiation from suitable sources. The actinic radiation exposure time can vary from a few seconds to minutes, depending upon the intensity and spectral energy distribution of the radiation, its distance from the photosensitive element, the desired image resolution, and the nature and amount of the photopolymerizable composition. Exposure temperatures are preferably ambient or slightly higher, i.e., about 20° C. to about 35° C. Exposure is of sufficient duration to crosslink the exposed areas down to the support or to the back exposed layer, i.e., floor. Imagewise exposure time is typically much longer than backflash exposure time, and ranges from a few to tens of minutes. Imagewise exposure sufficient to crosslink the exposed areas down to the support or the floor, can also be determined by providing energy density from the actinic radiation source of about 5000 to about 25000 milliJoules/cm$^2$ to the photosensitive element.

Actinic radiation sources encompass the ultraviolet and visible wavelength regions. The suitability of a particular actinic radiation source is governed by the photosensitivity of the initiator and the at least one monomer used in preparing the flexographic printing plates. The preferred photosensitivity of most common flexographic printing plates are in the UV and deep UV area of the spectrum, as they afford better room-light stability. Examples of suitable visible and UV sources include carbon arcs, mercury-vapor arcs, content fluorescent lamps, electron flash units, electron beam units, lasers, and photographic flood lamps. Examples of industry standard radiation sources include the Sylvania 350 Blacklight fluorescent lamp (FR48T12/350 VL/VHO/180, 115w), and the Philips UV-A "TL"-series low-pressure mercury-vapor fluorescent lamps. In some embodiments, a mercury vapor arc or a sunlamp can be used. In other embodiments, a high-ultraviolet content fluorescent lamp can be used at a distance of about 1 to about 10 inches (about 2.54 to about 25.4 cm) from the photosensitive element. These radiation sources generally emit long-wave UV radiation between 310-400 nm.

In some embodiments, the method to make the relief printing form includes a back exposure or backflash step. This is a blanket exposure to actinic radiation through the support. It is used to create a layer of polymerized material, or a floor, on the support side of the photopolymerizable layer and to sensitize the photopolymerizable layer. The floor provides improved adhesion between the photopolymerizable layer and the support and establishes the depth of the plate relief. The backflash exposure can take place before, after or during the other imaging steps. Any of the conventional radiation sources discussed above for the overall (imagewise) actinic radiation exposure step can be used for the backflash exposure step. Exposure time generally range from a few seconds up to a few minutes. In some embodiments, a floor for may be included in the photosensitive element when the photosensitive element is produced, such that a separate backflash exposure may not be necessary.

Following overall exposure to UV radiation through the mask, the exposed photosensitive element is treated to remove unpolymerized areas in the photopolymerizable layer and thereby form the relief surface. The treating step removes at least the photopolymerizable layer in the areas which were not exposed to actinic radiation, i.e., the unexposed areas or uncured areas or unpolymerized portions, of the photopolymerizable layer. Except for the elastomeric capping layer, in most embodiments the additional layers that may be present on the photopolymerizable layer are removed or substantially removed from the polymerized areas of the photopolymerizable layer. In some embodiments of the photosensitive elements having an in-situ mask, the treating step also removes the mask image (which had been exposed to actinic radiation) and the underlying unexposed areas of the photopolymerizable layer.

Treating of the photosensitive element includes "wet" development wherein the photopolymerizable layer is contacted with a suitable developer solution to washout unpolymerized areas. Wet development can be carried out with the developer solution at room temperature but usually is carried out at about 80 to 100° F. The developers or washout solutions is selected from organic solvents, aqueous solutions, or semi-aqueous solutions, and water. The choice of the developer will depend primarily on the chemical nature of the photopolymerizable material to be removed. Suitable organic solvent developers include aromatic or aliphatic hydrocarbon and aliphatic or aromatic halohydrocarbon solvents, or mixtures of such solvents with suitable alcohols. Other organic solvent developers have been disclosed in published German Application 38 28 551. Suitable semi-aqueous developers usually contain water and a water miscible organic solvent and an alkaline material. Suitable aqueous developers usually contain water and an alkaline material. Other suitable aqueous developer combinations are described in U.S. Pat. No. 3,796, 602.

Development time can vary based on the thickness and type of the photopolymerizable material, the solvent being used, and the equipment and its operating temperature, but it is preferably in the range of about 2 to about 25 minutes. Developer or washout solution can be applied in any convenient manner, including immersion, spraying and brush or roller application. Brushing aids can be used to remove the unpolymerized portions of the element. Washout can be carried out in an automatic processing unit which uses developer and mechanical brushing action to remove the uncured portions of the plate, leaving a relief constituting the exposed image and the floor.

Following treatment by developing in solution, the relief printing plates are generally blotted or wiped dry, and then more fully dried in a forced air or infrared oven. Drying times and temperatures may vary based on equipment design, air flow, plate material, however, typically the plate is dried for 60 to 120 minutes at 60° C. High temperatures are not recommended because the support can shrink and this can cause registration problems.

After the treatment step, the photosensitive element can be uniformly post-exposed to ensure that the photopolymerization process is complete and that the so formed flexographic printing plate will remain stable during printing and storage. This post-exposure step can utilize the same radiation source as the imagewise main exposure. Furthermore, if the surface of the flexographic printing plate is still tacky, detackification treatments may be applied. Such methods, which are also called "finishing", are well known in the art. For example, tackiness can be eliminated by a treatment of the flexographic printing plate with bromine or chlorine solutions. Preferably, detackification is accomplished by exposure to UV radiation sources having a wavelength not longer than 300 nm. This so-called "light-finishing" is disclosed in European Published Patent Application 0 017927 and U.S. Pat. No. 4,806,506. Various finishing methods may also be combined. Typically, the post-exposure and the finishing exposure are done at the same time on the photosensitive element using an exposure device that has both sources of radiation.

The present method prepares a relief printing form using a digital workflow that has been modified by imagewise exposing the photosensitive element through the in-situ mask to actinic radiation in an environment having an inert gas and an oxygen concentration of about 30,000 ppm to about 7500 ppm, and uses solution treatment to remove unpolymerized material. The modified digital workflow in the preparation of relief printing forms provides the advantages of conventional digital workflow to create the in-situ mask, and also provides the capability to create well-structured raised surface elements in which each raised element is finely conically-shaped and the top surface areas of the raised surface elements is flatter or substantially flat, and not as rounded as is typical of raised elements prepared by conventional digital workflow; and, fine well-structured raised surface elements of about 5 to about 30 micron in which each raised element has a sharp or substantially transition from the flat top print surface area to the side-wall-surface area, such that the shoulder area of the raised print elements does not or only minimally contributes to the total printing area of raised print element features. In some embodiments, the ink transferred to the substrate by the shoulder surface area is less than or equal to 20% of the total printing area by the raise print element. In some embodiments, the ink transferred to the substrate by the shoulder surface area is less than or equal to 15% of the total printing area by the raise print element. In some embodiments, the ink transferred to the substrate by the shoulder surface area is less than or equal to 10% of the total printing area by the raise print element. In some embodiments, the ink transferred to the substrate by the shoulder surface area is less than or equal to 5% of the total printing area by the raise print element. In some embodiments, the ink transferred to the substrate by the shoulder surface area is less than or equal to 2% of the total printing area by the raise print element. The present method of modified digital workflow provides a shape to the raised surface elements that is similar to that formed with analog workflow. In particular, the shape of the raised surfaces produced by the present process differs from the shape of the raised surfaces produced by the conventional digital workflow process and to some extent from the traditional analog process. The present method of modified digital workflow provides the print form with fully or substantially fully defined or formed small or fine feature elements, i.e., features less than about 30 micron, to hold or maintain microcell patterning in solid areas, and thus the capability to print increased density of ink in the print solid areas. The present invention provides for the capability to create the relief image on the printing form that essentially is the recreation of the in-situ mask image, particularly in terms of size of openings in mask relative to the size of the raise element (i.e., halftone dot).

After treatment of the precursor, the resulting relief printing form has relief structure forming a pattern that includes one or more individual surface elements raised from the floor for printing, and at least one recessed area which is a non-printing area. The mask having a plurality of openings and the imagewise exposure in an inert atmosphere having about 30,000 ppm to about 7500 ppm oxygen creates the fine individually-formed raised surface elements (in the printing area). Because the plurality of raised surface elements is individually formed, the printing area correspondingly also includes open portions (in which the photopolymerizable material was removed by treatment) that surround each individual raised surface element. Each of the raised surface elements of the plurality of individual raised surface elements has a top surface area that carries the imaging material, such as ink or coating material, which is printed onto the substrate. That is, the feature size or dot size of each of the plurality of raised surface elements is only slightly smaller than the mask openings used to form the raise elements. In some embodiments, the dot size of the plurality of raised surface elements is smaller than the corresponding mask openings by less than 4%. In other embodiments, the dot size of the plurality of raised surface elements is smaller than the corresponding mask openings by less than 2%. In most embodiments, each raised surface element prepared by the present method has a top surface, i.e., substantially flat surface area that transfers the imaging material, with a diameter between about 10 and about 90 micrometers.

The imaging material, such as an ink, that is printed on the substrate can be applied to the printing form, and in particular, to the plurality of raised surface elements by any means suitable. In most embodiments in relief printing, typically an anilox roller is used to meter the coating material onto the relief surface of the printing form. But the present method is not limited to the conventional method of application of the imaging material to the printing form.

Substrates suitable for printing by the present method are not limited and may have none, one, or more other layers or portions of layers present prior to the application of the imaging material. Examples of substrates include, but are not limited to, paper, paperboard, plastic, glass, polymeric films, etc.

Photosensitive Element

The photosensitive precursor element of the present invention used for preparing relief printing forms comprises at least one photopolymerizable layer. Relief printing forms encompass flexographic printing forms and letterpress printing forms. Relief printing is a method of printing in which the printing form prints from an image area, where the image area of the printing form is raised and the non-image area is depressed. Optionally, the photosensitive element includes a support. Optionally, the photosensitive element includes a layer of an actinic radiation opaque material adjacent the photopolymerizable layer. In one embodiment, the photosensitive element includes a layer of photopolymerizable composition composed at least of a binder, at least one ethylenically unsaturated compound, and a photoinitiator. In another embodiment, the layer of the photopolymerizable composition includes an elastomeric binder, at least one ethylenically unsaturated compound, and a photoinitiator. In some embodiments, the relief printing form is an elastomeric printing form (i.e., the photopolymerizable layer is an elastomeric layer) to accommodate the compression necessary for contact printing.

Unless otherwise indicated, the term "relief printing plate or element" encompasses plates or elements in any form suitable for flexographic printing and for letterpress printing. Unless otherwise indicated, the terms "photosensitive element" and "printing form" encompass elements or structures in any form suitable as precursors for printing, including, but not limited to, flat sheets, plates, seamless continuous forms, cylindrical forms, plates-on-sleeves, and plates-on-carriers.

The support can be any flexible material that is conventionally used with photosensitive elements used to prepare relief printing plates. In some embodiments the support is transparent to actinic radiation to accommodate "backflash" exposure through the support. Examples of suitable support materials include polymeric films such those formed by addition polymers and linear condensation polymers, transparent foams and fabrics. Under certain end-use conditions, metals such as aluminum, may also be used as a support, even though a metal support is not transparent to radiation. A preferred support is a polyester film; particularly preferred is polyethylene terephthalate. The support may be in sheet form or in cylindrical form, such as a sleeve. The sleeve may be formed from single layer or multiple layers of flexible material. Flexible sleeves made of polymeric films are preferred, as they typically are transparent to ultraviolet radiation and thereby accommodate backflash exposure for building a floor in the cylindrical printing element. A preferred sleeve is a multiple layered sleeve as disclosed in U.S. Pat. No. 5,301,610. The sleeve may also be made of non-transparent, actinic radiation blocking materials, such as nickel or glass epoxy. The support has a thickness typically from 0.002 to 0.250 inch (0.0051 to 0.635 cm). In some embodiments, the thickness for the sheet form is 0.003 to 0.016 inch (0.0076 to 0.040 cm). In some embodiments, the sleeve has a wall thickness from 4 to 80 mils (0.010 to 0.203 cm) or more.

Optionally, the element includes an adhesive layer between the support and the photopolymerizable layer, or a surface of the support that is adjacent the photopolymerizable layer has an adhesion promoting surface. The adhesive layer on the surface of the support can be a subbing layer of an adhesive material or primer or an anchor layer as disclosed in U.S. Pat. No. 2,760,863 and U.S. Pat. No. 3,036,913 to give suitable adhesion between the support and the photopolymerizable layer. Alternatively, the surface of the support on which the photopolymerizable layer resides can be treated to promote adhesion between the support and the photopolymerizable layer, with flame-treatment or electron-treatment, e.g., corona-treated.

The photosensitive element includes at least one layer of a photopolymerizable composition. As used herein, the term "photopolymerizable" is intended to encompass systems that are photopolymerizable, photocrosslinkable, or both. The photopolymerizable layer is a solid layer formed of the composition comprising a binder, at least one ethylenically unsaturated compound, and a photoinitiator. The photoinitiator has sensitivity to actinic radiation. Throughout this specification actinic light will include ultraviolet radiation and/or visible light. The solid layer of the photopolymerizable composition is treated with one or more solutions to form a relief suitable for relief printing. As used herein, the term "solid" refers to the physical state of the layer which has a definite volume and shape and resists forces that tend to alter its volume or shape. A solid layer of the photopolymerizable composition may be polymerized (photohardened), or unpolymerized, or both. In some embodiments, the layer of the photopolymerizable composition is elastomeric.

The binder can be a single polymer or mixture of polymers. In some embodiments, the binder is an elastomeric binder. In other embodiments, the layer of the photopolymerizable composition is elastomeric. Binders include natural or synthetic polymers of conjugated diolefin hydrocarbons, including polyisoprene, 1,2-polybutadiene, 1,4-polybutadiene, butadiene/acrylonitrile, and diene/styrene thermoplastic-elastomeric block copolymers. Preferably, the elastomeric block copolymer of an A-B-A type block copolymer, where A represents a non-elastomeric block, preferably a vinyl polymer and most preferably polystyrene, and B represents an elastomeric block, preferably polybutadiene or polyisoprene. In some embodiments, the elastomeric A-B-A block copolymer binders can be poly(styrene/isoprene/styrene) block copolymers, poly(styrene/butadiene/styrene) block copolymers, and combinations thereof. The binder is present in an amount of about 10% to 90% by weight of the photosensitive composition. In some embodiments, the binder is present at about 40% to 85% by weight of the photosensitive composition.

Other suitable binders include acrylics; polyvinyl alcohol; polyvinyl cinnamate; polyamides; epoxies; polyimides; styrenic block copolymers; nitrile rubbers; nitrile elastomers; non-crosslinked polybutadiene; non-crosslinked polyisoprene; polyisobutylene and other butyl elastomers; polyalkyleneoxides; polyphosphazenes; elastomeric polymers and copolymers of acrylates and methacrylate; elastomeric polyurethanes and polyesters; elastomeric polymers and copolymers of olefins such as ethylene-propylene copolymers and non-crosslinked EPDM; elastomeric copolymers of vinyl acetate and its partially hydrogenated derivatives.

The photopolymerizable composition contains at least one compound capable of addition polymerization that is compatible with the binder to the extent that a clear, non-cloudy photosensitive layer is produced. The at least one compound capable of addition polymerization may also be referred to as a monomer and can be a single monomer or mixture of monomers. Monomers that can be used in the photopolymerizable composition are well known in the art and include, but are not limited to, addition-polymerization ethylenically unsaturated compounds with at least one terminal ethylenic group. Monomers can be appropriately selected by one skilled in the art to provide elastomeric property to the photopolymerizable composition. The at least one compound capable of addition polymerization (i.e., monomer) is present in at least an amount of 5%, typically 10 to 20%, by weight of the photopolymerizable composition.

The photoinitiator can be any single compound or combination of compounds which is sensitive to actinic radiation, generating free radicals which initiate the polymerization of the monomer or monomers without excessive termination. Any of the known classes of photoinitiators, particularly free radical photoinitiators may be used. Alternatively, the photoinitiator may be a mixture of compounds in which one of the compounds provides the free radicals when caused to do so by a sensitizer activated by radiation. In most embodiments, the photoinitiator for the main exposure (as well as post-exposure and backflash) is sensitive to visible or ultraviolet radiation, between 310 to 400 nm, and preferably 345 to 365 nm. Photoinitiators are generally present in amounts from 0.001% to 10.0% based on the weight of the photopolymerizable composition.

The photopolymerizable composition can contain other additives depending on the final properties desired. Additional additives to the photopolymerizable composition include sensitizers, plasticizers, rheology modifiers, thermal polymerization inhibitors, colorants, processing aids, antioxidants, antiozonants, dyes, and fillers.

The thickness of the photopolymerizable layer can vary over a wide range depending upon the type of printing plate desired, for example, from about 0.005 inches to about 0.250 inches or greater (about 0.013 cm to about 0.64 cm or greater). In some embodiments, the photopolymerizable layer has a thickness from about 0.005 inch to 0.0450 inch (0.013 cm to 0.114 cm). In some other embodiments, the photopolymerization layer has a thickness from about 0.020 inches to about 0.112 inches (about 0.05 cm to about 0.28 cm). In other embodiments, the photopolymerizable layer has a thickness from about 0.112 inches to about 0.250 inches or greater (0.28 cm to about 0.64 cm or greater).

It is well within the skill of the practitioner in the art to prepare a photosensitive precursor element that includes a layer of the photopolymerizable composition formed by admixing the binder, monomer, initiator, and other ingredients. In most embodiments, the photopolymerizable mixture is formed into a hot melt and, then optionally extruded, calendered to the desired thickness and planar or cylindrical shape. The photosensitive element includes at least one photopolymerizable layer that can be of a bi- or multi-layer construction. Further, the photosensitive element may include an elastomeric capping layer on the at least one photopolymerizable layer. Multilayer cover elements and compositions suitable as the elastomeric capping layer are disclosed in Gruetzmacher et al., U.S. Pat. No. 4,427,759 and U.S. Pat. No. 4,460,675.

The photosensitive element can include the actinic radiation opaque layer disposed above a surface of the photopolymerizable layer opposite the support, or can form an assemblage with separate carrier or element that includes the actinic radiation opaque layer. With the exception of traditional silver-halide based materials forming phototools, materials constituting the actinic radiation opaque layer and structures incorporating the actinic radiation opaque layer are not particularly limited, provided that the radiation opaque layer can be imagewise exposed to form the in-situ mask on or adjacent the photopolymerizable layer of the photosensitive element. The actinic radiation opaque layer may substantially cover the surface or only cover an imageable portion of the photopolymerizable layer. The actinic radiation opaque layer is substantially opaque to actinic radiation that corresponds with the sensitivity of the photopolymerizable material. The actinic radiation opaque layer can be used with or without a barrier layer. If used with the barrier layer, the barrier layer is disposed between the photopolymerizable layer and the radiation opaque layer to minimize migration of materials between the photopolymerizable layer and the radiation opaque layer. Monomers and plasticizers can migrate over time if they are compatible with the materials in an adjacent layer, which can alter the laser radiation sensitivity of the radiation opaque layer or can cause smearing and tackifying of the radiation opaque layer after imaging. The actinic radiation opaque layer is also sensitive to laser radiation that can selectively remove or transfer the opaque layer.

In one embodiment, the actinic radiation opaque layer is sensitive to infrared laser radiation. In some embodiments, the actinic radiation opaque layer comprises a radiation-opaque material, an infrared-absorbing material, and an optional binder. Dark inorganic pigments, such as carbon black and graphite, mixtures of pigments, metals, and metal alloys generally function as both infrared-sensitive material and radiation-opaque material. The optional binder is a polymeric material which includes, but is not limited to, self-oxidizing polymers, non-self-oxidizing polymers, thermochemically decomposable polymers, polymers and copolymers of butadiene and isoprene with styrene and/or olefins, pyrolyzable polymers, amphoteric interpolymers, polyethylene wax, materials conventionally used as the release layer described above, and combinations thereof. The thickness of the actinic radiation opaque layer should be in a range to optimize both sensitivity and opacity, which is generally from about 20 Angstroms to about 50 micrometers. The actinic radiation opaque layer should have a transmission optical density of greater than 2.0 in order to effectively block actinic radiation and the polymerization of the underlying photopolymerizable layer.

The photosensitive element may include the actinic radiation opaque layer disposed above and covers or substantially covers the entire surface of the photopolymerizable layer. In this case the infrared laser radiation imagewise removes, i.e., ablates or vaporizes, the radiation opaque layer to form the in-situ mask. Suitable materials and structures for this actinic radiation opaque layer are disclosed by Fan in U.S. Pat. No. 5,262,275; Fan in U.S. Pat. No. 5,719,009; Fan in U.S. Pat. No. 6,558,876; Fan in EP 0 741 330 A1; and Van Zoeren in U.S. Pat. Nos. 5,506,086 and 5,705,310. A material capture sheet adjacent the radiation opaque layer may be present during laser exposure to capture the material as it is removed from the photosensitive element as disclosed by Van Zoeren in U.S. Pat. No. 5,705,310. Only the portions of the radiation opaque layer that were not removed from the photosensitive element will remain on the element forming the in-situ mask.

In another embodiment, the photosensitive element will not initially include the actinic radiation opaque layer. A separate element bearing the radiation opaque layer will form an assemblage with the photosensitive element such that the radiation opaque layer is adjacent the surface of the photosensitive element opposite the support, which is typically is the photopolymerizable layer. Of present, a coversheet associated with the photosensitive element typically is removed prior to forming the assemblage.) The separate element may include one or more other layers, such as ejection layers or heating layers, to aid in the digital exposure process. Hereto, the radiation opaque layer is also sensitive to infrared radiation. The assemblage is exposed imagewise with infrared laser radiation to selectively transfer or selectively alter the adhesion balance of the radiation opaque layer and form the image on or disposed above the photopolymerizable layer. Materials and structures suitable for this actinic radiation opaque layer are disclosed by Fan et al. in U.S. Pat. No. 5,607,814; and Blanchett in U.S. Pat. Nos. 5,766,819; 5,840,463; and EP 0 891 877 A. As a result of the imagewise transfer process, only the transferred portions of the radiation opaque layer will reside on the photosensitive element forming the in-situ mask.

The photosensitive printing element of the present invention may further include a temporary coversheet on top of the uppermost layer of the element. One purpose of the coversheet is to protect the uppermost layer of the photosensitive printing element during storage and handling. Examples of suitable materials for the coversheet include thin films of polystyrene, polyethylene, polypropylene, polycarbonate, fluoropolymers, polyamide or polyesters, which can be subbed with release layers.

Printing Method

The steps of mounting the relief printing form on a printing press, inking the printing areas (that is, the raised portions of the relief surface) of the printing form, and contacting the inked printing areas to the substrate to transfer the pattern of ink onto the substrate are not limited, and encompass various conventional and non-conventional practices for mounting, inking, and contacting to print as is known to those skilled in the art of flexographic printing. The Fourth Edition published in 1992, and the Fifth Edition, published in 1999, of *Flexography: Principles and Practice*, published by the Foundation of Flexographic Technical Association, (Ronkonkoma, N.Y.) are suitable sources representing the field of knowledge in many aspects of flexographic printing. In particular, the chapters on mounting and proofing, the printing press, inks, flexographic printing plates, and substrates, are most applicable to the present invention.

Mounting of the relief printing form onto a printing cylinder or other support in a printing press can be accomplished in any manner. In some embodiments, the printing form can be mounted directly onto the printing cylinder or other press support with an adhesive, typically is double-sided adhesive tape. In other embodiments, the printing form can be mounted onto a carrier sheet with the double-sided adhesive tape. Attached to a leading end of the carrier sheet is a mounting bar which mates with a slot in the printing cylinder to thereby secure the carrier with the printing form to the printing cylinder. In other embodiments, the printing form can be mounted onto a sleeve support with double-sided adhesive tape. The sleeve support is then mounted onto the printing cylinder in most embodiments by sufficiently expanding the support with air so that the support can slide onto the cylinder and has an interference fit once the air is removed. One or more relief printing forms can be mounted on the printing cylinder or carrier. In some embodiments, the relief form is the same dimension as the precursor photosensitive element. In other embodiments, the relief printing form is a segment, sometimes referred to as a slug, of the precursor photosensitive element. In yet other embodiments, the relief printing form is a composite of several segments or slugs mounted onto an intermediate such as the carrier or sleeve. One method for mounting relief printing form onto a printing cylinder is described by Fox et al. in U.S. Pat. No. 5,562,039.

It is desirable to assure the accurate positioning of the relief printing form or forms when mounting onto the print cylinder or onto the intermediate in order for the printed image on the substrate to be registered. The relief printing form should be positioned on the cylinder such that the printing is parallel to the axis of the printing cylinder, that is, not skewed. In multicolor printing, the relief printing form for each color being printed should be aligned so that the different color printed images are registered with each other. Registration errors give rise to superimposed colors, spaces with no color, color shifts, and/or degraded image detail. Mounting of the relief printing form, as well as color registration and proofing, can be conducted off the press by means of commercially available mounting-proofing machines designed for this purpose. These machines, which usually make use of an optical or video mounting system, make it possible to mount the printing forms on the print cylinder to effect color registration, a procedure essential to the maintenance of both quality and economy in all flexographic operations.

Application of ink to the printing areas of the printing form is not limited. Most conventional embodiments for relief printing use an anilox roll to meter the ink onto the printing areas of the relief printing form. The anilox roll is a metering roll that is used to meter a controlled film of ink from a fountain roller to the relief surface of the printing form. The anilox roll can be a metal, metal-coated, or ceramic-coated roll. The anilox roll includes a multiplicity of cells that are mechanically- or laser-engraved into the face of the roll, and that carrying a volume of ink to the printing form.

The ink used in the present invention is not limited and can include fluid inks, such as water-base inks and solvent inks, dye-based inks, pigment-based inks, and paste inks etc. The ink typically includes at least a colorant and a vehicle, and a solvent to adjust the viscosity for suitable printing and drying. In most embodiments, the ink is a solvent ink.

Contacting of the ink from the printing areas of the relief printing form to the substrate transfers the pattern of ink onto the substrate. Transferring may also be referred to as printing. The printing areas of the relief printing form consist of the raised surfaces of the relief structure. In one embodiment, ink is applied to the relief printing form via a metering roller, commonly referred to as an anilox roller, containing pores of defined volume that meter a specific amount of ink to the print form. The print form is then placed in contact with the substrate transferring some portion of the ink from the print form to the substrate. Contacting the ink that resides on the printing areas to the substrate transfers the ink such that the pattern of ink is formed on the substrate when the relief printing form is separated from the substrate. In general, the amount of ink transferred to the substrate is a function of the amount of ink on the printing form, the pressure between the relief printing form and the substrate as well as the image pattern of the relief printing form, and the relief structure of the pattern. Optionally, pressure may be applied to the relief printing form to assure contact and complete transfer of the ink to the substrate. In printing, the pressure suitable for contacting the printing areas to the substrate is usually referred to as an impression setting which is applicable to the particular printing press. Impression settings can include minimum or "kiss" impression setting, and impression settings that apply greater pressure between the print form and the substrate typically defined in terms of the additional distance that one or both the print form and substrate are moved towards each other. In most embodiments, the minimum impression is that impression setting that provides uniform 100% solid ink coverage across the width of the printed substrate. However, commercial printing operations typically do not print with a minimum impression setting.

The orientation of an image relative to print direction can influence the printing the shoulder surface area with the top surface area of the raised print features such as halftone dots, lines and text images, and thus could impact individual results for printing forms prepared by the present method. Printing forms prepared by the present method create sharp or substantially sharp shoulder areas that transition from the flat print surface to the side-wall surface (i.e., avoid or minimize the formation of broadened shoulders) on raised printing features. For printing forms prepared by the present invention, raised print features that form positive lines can be in any orientation relative to the print direction of rotary printing and no or only minimal influence of the shoulder area in the printed image. For clarity, positive lines that are positioned on the printing form (as the printing form is mounted onto the print cylinder) so that the length of the positive lines travel in the direction of rotation of the print cylinder (and substrate) are considered as oriented in the print direction. For positive lines that are positioned on the printing form (as the printing form is mounted onto the print cylinder) so that the length of the positive lines is parallel to the axis of rotation of the print cylinder are considered as oriented in the perpendicular to the print direction. Orientation of lines formed during imaging of the in-situ mask with laser radiation can also influence the resulting quality of the line width and shoulder printing by the resulting printing form. In most embodiments, the print form precursor is mounted on a drum of an infrared laser radiation imaging apparatus. The in-situ mask having lines that are imaged along the circumference of the drum have better quality than lines that are imaged parallel to the drum (axis).

Contacting the ink to the substrate to transfer the pattern may be accomplished in any manner. Contacting the ink may be by moving the relief printing form to the substrate, or by moving the substrate to the relief printing form, or by moving both the substrate and the relief printing form into contact. In one embodiment, the functional material is transferred manually. The present method typically occurs at room temperature, that is, at temperatures between 17 to 30° C. (63 to 86° F.), but is not so limited.

The substrate has a surface suitable for printing. The type of substrate is not limited, and can include polymeric films, paper, foils, and label stock. In most embodiments the substrate is single layer and is uniformly supported by an impression roll. In most embodiments, the printed substrate is a polymeric film.

GLOSSARY

"Lines per inch" (LPI) is a measurement of printing resolution in systems which use a halftone screen. It is a measure of how close together lines in a halftone grid are. Higher LPI generally indicates greater detail and sharpness to an image.

"Halftone" is used for the reproduction of continuous-tone images, by a screening process that converts the image into dots of various sizes and equal spacing between centers. A halftone screen enables the creation of shaded (or grey) areas in images that are printed by transferring (or non-transferring) of a printing medium, such as ink.

"Dots per inch" (DPI) is a frequency of dot structures in a tonal image, and is a measure of spatial printing dot density, and in particular the number of individual dots that can be placed within the span of one linear inch (2.54 cm). The DPI value tends to correlate with image resolution. Typical DPI range for graphics applications: 75 to 150, but can be as high as 200.

"Line screen resolution", which may sometimes be referred to as "screen ruling" is the number of lines or dots per inch on a halftone screen.

"Mask opening" is the "clear" area of an integral mask to allow exposure to actinic radiation of the underlying photopolymerizable material. (In some embodiments, the clear area is created by removal of actinic radiation opaque material from the element. In other embodiments, the clear area is created non-transfer of actinic radiation opaque material to the element.) Mask opening is measured with a measuring microscope. The effective mask opening area is calculated by measuring the area of the opening and dividing by the total pixel area defined by the screen resolution in lines per inch (LPI). The total pixel area is calculated using the equation $(1/LPI)^2$ and the effective mask opening is defined as the (opening area)/$(1/LPI)^2$. The mask opening is typically expressed as a percentage (of total pixel area).

"Phototool opening" is the area of the phototool that is transparent to actinic radiation expressed as a percentage of the total pixel area and is calculated similar to the above mask opening area.

"Optical Density" or simply "Density" is the degree of darkness (light absorption or opacity) of an image, and can be determined from the following relationship:

$$\text{Density} = \log_{10}\{1/\text{reflectance}\} \text{ where}$$

reflectance is {intensity of reflected light/intensity of incident light}

"Dot size on plate" is a measure of the diameter of the dot commonly assessed using a calibrated microscope or specialized optical apparatus. The measurement typically represents accurately the flat portion of the dot structure on the plate.

"Dot area on plate" or "plate dot area" is commonly expressed as a percentage and is generally calculated by converting the dot size to an area (area=$\pi r^2$) and dividing by the total pixel area as defined by the screen resolution.

"Effective Printed Dot Area" is a calculated quantity based on the density measurements of region printed with a regular array of dots of uniform size called a tint area and density measurements of a printed region with complete ink coverage (also referred to as 100% coverage or solid coverage). The equation used is called the Murray Davies equation and is represented below:

$$\text{Effective printed dot area} = (1-10^{-Dt})/(1-10^{-Ds})$$

where Dt=tint density and Ds=solid density

"Effective printing area (dot area) under pressure" is the dot area on the plate expressed as a percent of the total area that will come in contact with the substrate to be printed when the plate and substrate are in intimate contact with each other and when the plate/substrate exert pressure on each other.

"Plate to Print Dot Gain" represents the growth in the printed dot area from the dot area on plate expressed as a percentage of the total pixel area, to the effective printed dot area expressed as a percentage of coverage area. This is simply the difference between the two.

EXAMPLES

In the following examples, all percentages are by weight unless otherwise noted. CYREL® photopolymerizable printing plates, CYREL® Digital Imager, CYREL® exposure unit, and CYREL® processor, are all available from The DuPont Company (Wilmington, Del.).

Instrumentation

Common imaging techniques, such as a microscope or optical devices, may be used to determine the observed dot area of the printing plate, and the print samples. One example of a suitable optical device is a Betaflex flexo analyzer unit, from Beta Industries (Carlstadt, N.J.), which captures the raised structure of a relief printing form as an image for measurement and analysis of relief characteristics such as dot area, screen ruling, and dot quality.

A measuring microscope (Nikon Measurescope, model MM-11, from NIKON (USA) (Melville, N.Y.)) was used to capture images of the features on the plates.

A Hirox 3D Digital Microscope was used to measure dot shape and size, and depth of the recessed areas, and other features as indicated in the raised areas of a plate.

Example 1

The photosensitive elements used were CYREL® flexographic printing precursor, type DPR (45 mils), which included a support; a layer of a photopolymerizable composition adjacent the support which was composed of an elastomeric binder, an ethylenically unsaturated compound, photoinitiator, and other additives: adjacent the photopolymerizable layer opposite the support was a layer of a composition having an actinic radiation opaque material and a binder, which was capable of being ablated from the precursor by infrared laser radiation; and a coversheet adjacent the ablatable layer.

The coversheet was removed from the precursor. The precursor was mounted on a CYREL® Digital Imager Advance Cantilever 1450, and an in-situ mask was formed on the element by ablating the ablatable layer with infrared laser radiation to form an in-situ mask on the precursor. The in-situ mask contained test targets having a variety of features that included line work and a screen area having at least a 1-99% halftone dots, line work, in different orientations. In addition, the in-situ mask included a plurality of open areas, which create solid printing surface areas for printing by the resulting printing plate. Some of the plurality of open areas included a screen pattern that formed microcells on the printing surface area of the resulting plate that printed areas of solid ink density. Several microcell patterns were used, each for a different open area. The microcell patterns used came with the software package for the CYREL® Digital Imager. Some of the plurality of open areas did not include a microcell pattern. The mask image used in the imagewise exposure was the same for all precursors, but the each precursor was imagewise exposed in different environment conditions. The element was exposed on a CYREL® 3000 ETL-n exposure unit to ultraviolet radiation at 365 nm at energy density of 18.5 mWatts/cm² for an overall exposure through the support for 60 seconds, and for imagewise exposure through the in-situ mask in the exposure environment having nitrogen as the inert gas and a concentration of oxygen as indicated in Table below for 12 minutes. For some exposures in an environment of nitrogen and 1% oxygen concentration, a tank of gas was purchased from a supplier who premixed nitrogen and oxygen to have at the 1% oxygen concentration, which is identified as "premix".

All the photosensitive precursors were oriented so that the in-situ mask was face-up on the exposure bed, and facing open space of an exposure chamber. The CYREL® Exposure unit ETL-n included an exposure chamber as described in US Patent Publication US 2009/0191483 for overall exposure of the photosensitive element through the in-situ mask (i.e., imagewise exposure of the photopolymerizable layer) to ultraviolet radiation in an environment at the conditions described below. The exposure chamber resided on a bed of the exposure unit such that the glass of the bed formed one side of the exposure chamber, and was sufficiently sized to accommodate the planar-shaped photosensitive printing element. The source of ultraviolet radiation was located external to the chamber. The exposure chamber included a top side (i.e., a roof) and wall sides attached to the perimeter of the top side, all of which were transparent or substantially transparent to the actinic radiation, e.g., ultraviolet radiation, for the radiation to transmit through to the photosensitive element without appreciable scattering or absorbance. The walls were of a height sufficient to create an open space in the chamber above the photosensitive element so that a blanket of an environment of the inert gas and controlled oxygen concentration was created adjacent the in-situ mask of the photosensitive element. The exposure chamber included inlet port/s for introducing an inert gas, which was nitrogen, and optionally oxygen into the chamber. The exposure chamber included outlet port/s for purging air and other gases from the chamber so that the environment inside the chamber can be controlled at the desired conditions. More than one meter may have been used in order to monitor the concentration of oxygen over a broad range of possible oxygen concentrations in the exposure chamber, since an oxygen meter may be capable of measuring only a portion of the possible range of oxygen concentrations. The oxygen concentration meter/s were located at the inlet port and measurement of the oxygen concentration at the inlet was representative of the concentration of oxygen in the internal environment of the exposure chamber. The environment in the chamber was attained by a 5 minute purge at 50 liter/minute with a pre-determined mixture of nitrogen and oxygen, and maintained after start of the exposure by continued flow of the mixture into the chamber at 20 liter/minute.

The photosensitive precursors were processed in a CYREL® solvent processor SMART 2000P, at the conditions recommended for 45 mil thick plates, using Flexosol solvent at 30° C. temperature to form a relief surface suitable for flexographic printing. The plate was dried for 2.5 hour, and post exposed and finished exposure with 4 minute UV-A and 5 minute UV-C.

The relief image of the printing plate was evaluated for microcell quality, edge sharpness and dimensions, highlight quality and stability, and the results were increased loss of definition for the microcell pattern and increased instability of the finest highlight dots with increase oxygen concentration.

The printing plate was mounted onto a Fischer & Krecke Flexpress 6S printing press and used to print white polyethylene substrate with solvent ink (Siegwerk, N.C. 402) at 100 micron impression (anilox with 420 line/cm and 3.4 cm³/m² volume) and 400 meter/minute speed. The printed images were evaluated for density of the ink in solid printed area and graininess as shown in the following Table. Graininess is the amount of variation of density within a single tile.

TABLE

| Test | Environment Nitrogen and | Solid Ink Density* | | | | Graininess* | | | |
|---|---|---|---|---|---|---|---|---|---|
| | | Solid | MC-1 | MC-2 | MC-3 | Solid | MC-1 | MC-2 | MC-3 |
| A | 1% oxygen premix | 1.13 | 1.39 | 1.32 | 1.28 | 0.24 | 0.07 | 0.15 | 0.18 |
| B | 1% oxygen | 1.11 | 1.19 | 1.26 | 1.18 | 0.26 | 0.09 | 0.15 | 0.23 |
| C | 2% oxygen | 1.09 | 1.24 | 1.00 | 1.16 | 0.26 | 0.23 | 0.34 | 0.25 |
| D | 3% oxygen | 1.08 | 1.04 | 0.97 | 1.16 | 0.28 | 0.32 | 0.34 | 0.24 |

*Density of the ink in solid printed areas, an average of 20 readings, where MC-1 is one type of microcell pattern; and MC-2 is another type of microcell pattern.

The results demonstrated that overall the density of the ink in the solid areas (i.e., solid ink density) printed on the substrate by the plate decreased with increasing oxygen content in the environment during imagewise exposure. Even so, the solid ink density at 3% oxygen concentration of the exposure environment was substantially the same or somewhat better depending on the microcell pattern than the solid areas having no microcell pattern.

Also that the graininess of the ink density in the solid areas printed on the substrate by the plate increased with increasing oxygen content in the environment during imagewise exposure showing poor ink laydown. The graininess of the ink density for solid areas having microcell pattern was comparable to or better than the graininess of the ink density for solid areas having no microcell pattern, depending upon the type of microcell pattern used. Taking into account both the solid ink density and the graininess indicated that the oxygen concentration during imagewise exposure for relief plates undergoing washout would be about 3%. One would expect that print quality relative to solid ink density and/or graininess would decline as relief plates are prepared in environments with inert gas and concentration of oxygen above about 3%.

The printed images were also evaluated for highlight performance at 70 lines/cm, as shown in the following Table.

| % area | Print form prepared by imagewise exposing in nitrogen and oxygen concentration of | | |
|---|---|---|---|
| | 1% | 2% | 3% |
| 0.4 | 11.7 | 15.3* | 0.2* |
| 0.8 | 14.5 | 14.0* | 19.9* |
| 1.2 | 13.9 | 15.7* | 16.6* |
| 2 | 18.3 | 13.8 | 13.2 |
| 5 | 30.7 | 24.3 | 23.1 |
| 10 | 43.0 | 38.3 | 39.1 |
| 30 | 70.9 | 68.7 | 68.9 |
| 50 | 85.6 | 83.2 | 83.8 |
| 70 | 97.6 | 94.2 | 95.2 |
| 90 | 101.1 | 99.8 | 100.6 |
| 100 | 100.0 | 100.0 | 100.0 |

*Relief elements, i.e., dots, were missing or provided unstable print.

With increasing oxygen concentration the dot sharpening effect gets more and more visible as the very fine dots are not stable enough for printing showing the need for higher bump and, therefore, loss of steps.

Example 2

Example 1 was repeated as described above except that a CYREL® flexographic printing precursor, type 45DPN was also included with type 45DPR, and that the environment during imagewise exposure was as indicated in the Table below. The 45DPR included a support; a layer of a photopolymerizable composition adjacent the support which was composed of an elastomeric binder, an ethylenically unsaturated compound, photoinitiator, and other additives; adjacent the photopolymerizable layer opposite the support was a layer of a composition having an actinic radiation opaque material and a binder, which was capable of being ablated from the precursor by infrared laser radiation; and a coversheet adjacent the ablatable layer. The precursors were ablated with infrared laser radiation to form the in-situ mask, imagewise exposed to uv radiation in an environment having nitrogen as the inert gas and a concentration of oxygen as indicated, back exposed, treated with a solvent washout solution, dried, and finished to form the relief printing plate, and then printed as described above in Example 1.

The printing plate was mounted onto the printing press and printed at the conditions given for Example 1. The printed images were evaluated for density of the ink in solid printed area and graininess as shown in the following Table.

| Test | Type | Environment: Nitrogen and | Solid Ink Density* | | |
|---|---|---|---|---|---|
| | | | Solid | MC-1 | MC-2 |
| A | DPR | 0.5% oxygen | 1.07 | 1.31 | 1.28 |
| B | DPN | 0.5% oxygen | 1.08 | 1.34 | 1.25 |

Figure 2:
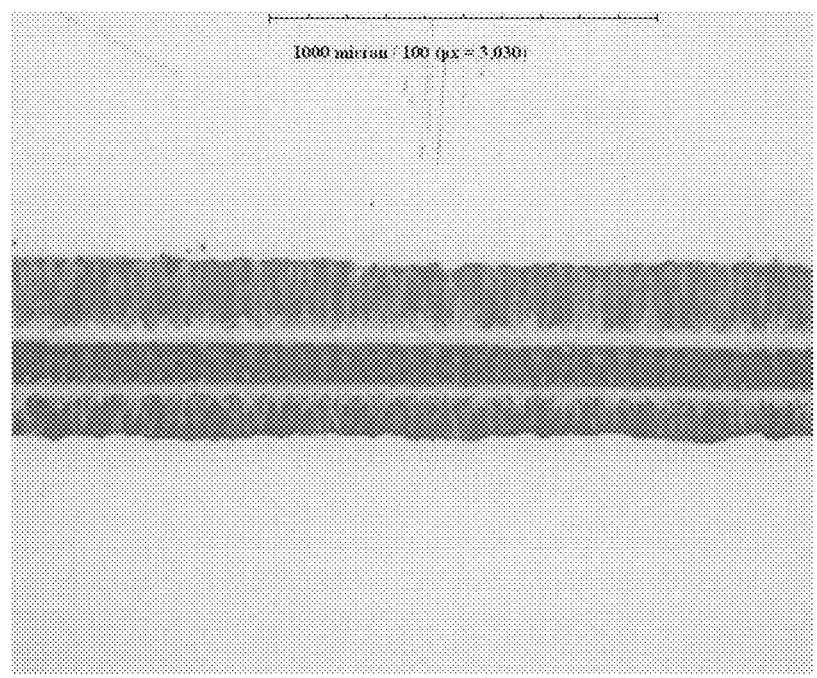
Figure 3:
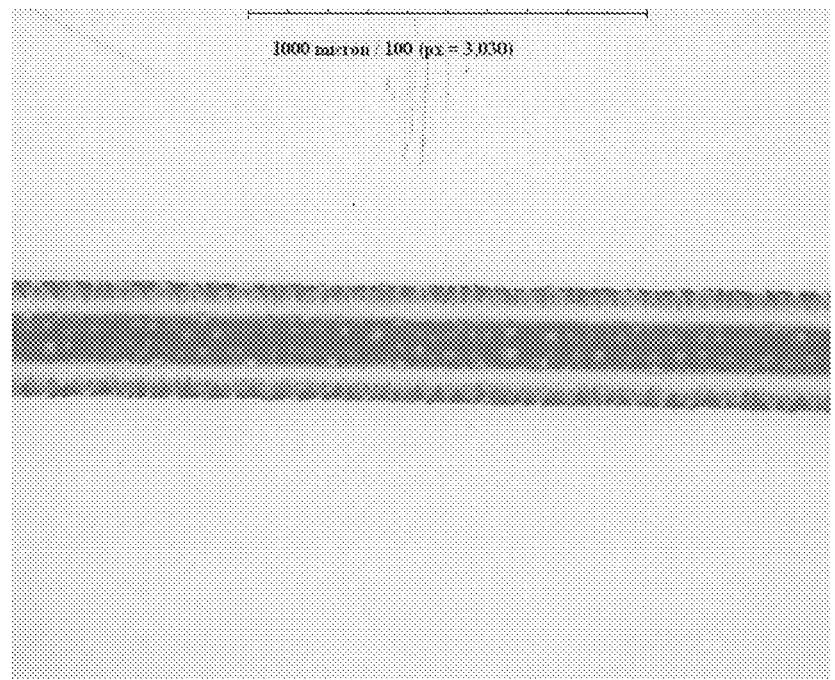
Figure 4:
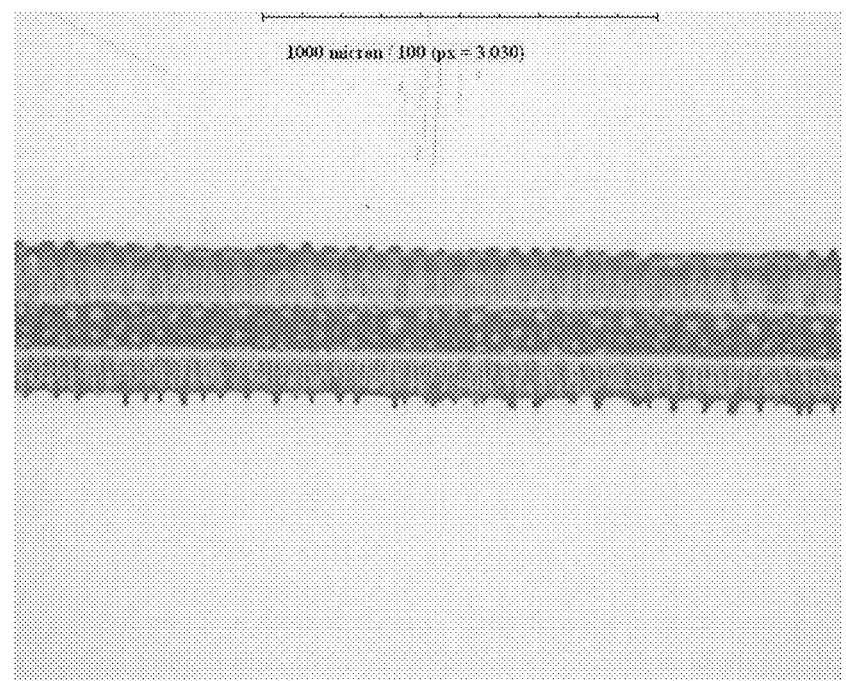

As shown in FIG. 1 through FIG. 4, it was observed that from print samples shoulder formation occurred for plates prepared by exposing in an environment containing nitrogen as the inert gas and an oxygen concentration 0.5%, and was printing of the shoulder was exacerbated by the orientation of the image relative to direction of rotation of the cylinder. FIG. 1 and FIG. 2 are reproductions of an image of a positive line printed on the substrate by the 45DPR relief print plate, and FIG. 3 and FIG. 4 are reproductions of an image of a positive line printed on the substrate by the 45DPN relief print plate prepared as described in Example 2. One can clearly observe that the printed positive line was wider when the positive line was printed perpendicular to the print direction as shown in FIG. 2 when compared to the same size positive line printed in the print direction as shown in FIG. 1. One can clearly observe that the printed positive line was wider when the positive line was printed perpendicular to the print direction as shown in FIG. 4 when compared to the same size positive line printed in the print direction as shown in FIG. 3. The difference in printed line width for both relief plates was also influenced by the orientation during imaging of the mask on the drum of the laser radiation imager.

Thus preparing a print form by exposing in an environment containing an inert gas and a concentration of oxygen of about 0.5% (or less than about 0.75%) creates shoulders on fine raised features that are broad and unacceptable print quality. While it is possible that acceptable print quality of positive lines could be attained if the image orientation was appropriately aligned with the print direction, it is unrealistic that this condition could be maintained across the variety of images and orientation to printed substrate that is used in relief printing.

Example 3

The photosensitive elements used were CYREL® flexographic printing precursor, type DPR (67 mils), which included a support; a layer of a photopolymerizable composition adjacent the support which was composed of an elastomeric binder, an ethylenically unsaturated compound, photoinitiator, and other additives; adjacent the photopolymerizable layer opposite the support was a layer of a composition having an actinic radiation opaque material and a binder, which was capable of being ablated from the precursor by infrared laser radiation; and a coversheet adjacent the ablatable layer.

Several plates were prepared from the photosensitive element precursors as follows. The coversheet was removed from the precursor. The precursor was mounted on a CYREL® Digital Imager Spark, and an in-situ mask was formed on the element by ablating the ablatable layer with infrared laser radiation at 3.4 Joules to form an in-situ mask on the precursor. The in-situ mask image contained having a variety of features including crosshairs with a 0.25 point stroke, screen areas having 1-99% halftone dots, and tone scales starting with grey level 1, grey level 2, and grey level 3. The mask image used in the imagewise exposure was the same for all precursors, but each precursor was imagewise exposed in different environment conditions. The precursors were exposed on a CYREL® exposure unit to ultraviolet radiation of 365 nm at 16.8 mW/cm² for a backflash exposure through the support for 85 seconds; and, for imagewise exposure through the in-situ mask in an exposure environment having nitrogen as the inert gas and a concentration of oxygen as indicated in Table below for 10 minutes.

| Example 3 | Imagewise Exposure Environment | |
| --- | --- | --- |
| Plate 3A | 99.5% N₂ | 0.5% O₂ |
| Plate 3B | 99.25% N₂ | 0.75% O₂ |
| Plate 3C | 98.7% N₂ | 1.3% O₂ |
| Plate 3D | 98.0% N₂ | 2.0% O₂ |
| Plate 3E | 97.0% N₂ | 3.0% O₂ |
| Plate 3F | 96.0% N₂ | 4.0% O₂ |

The nitrogen/oxygen mixtures were controlled using mixing valves blending 99.995% nitrogen with air and measuring oxygen levels with an Advanced Micro Instruments Model 111P Oxygen Analyzer until the desired nitrogen/oxygen mixtures were obtained. The exposure unit included an to exposure chamber substantially the same as described in US Patent Publication US 2009/0191483. The exposure chamber was purged for 300 seconds at a flow rate of 50 liters/minutes to ensure the nitrogen/oxygen mixture was stable. During the 10 minutes of main exposure the flow rate was reduced to 20 liters/minute. The source of ultraviolet radiation was located external to the chamber. The exposure chamber included a top side (i.e., a roof) and wall sides attached to the perimeter of the top side, all of which were transparent or substantially transparent to the actinic radiation, e.g., ultraviolet radiation, for the radiation to transmit through to the photosensitive element without appreciable scattering or absorbance. All the photosensitive precursors were oriented so that the in-situ mask was face-up on the exposure bed, and facing open space of an exposure chamber.

The photosensitive precursors were processed in a CYREL® 1000P solvent processor, under agitation and scrubbing, at the conditions recommended for 67 mil thick plates, using CYLOSOL® solvent at 92-94° F. temperature to form a relief surface suitable for flexographic printing. The plate was dried for 2 hours, and post exposed to UV-A for 3 minutes and finished exposure to UV-C for 5 minutes.

The relief image of the printing plate was evaluated for shoulder angle and minimum dots held on plate. Shoulder angle was measured by cross-sectioning the 0.25 point crosshair and examining it under an optical microscope. Examination of the minimum dots held on plate is a simple visual analysis of the smallest highlight dots of the plate,

| Example 3 | % Oxygen Conc. | Shoulder Angle | Minimum Dot Held |
| --- | --- | --- | --- |
| Plate 3A | 0.50% | 39.3 | 1.00% |
| Plate 3B | 0.75% | 45.1 | 1.00% |
| Plate 3C | 1.30% | 47.2 | 1.00% |
| Plate 3D | 2.00% | 49.1 | 1.00% |
| Plate 3E | 3.00% | 48.8 | 1.00% |
| Plate 3F | 4.00% | 49.0 | 2.00% |

The results demonstrated that for relief printing plates prepared from photosensitive precursors that are imagewise exposed in an environment having an inert gas and a concentration of oxygen between 0.75% and 3%, and treated by washout in a solvent solution, the latitude for the imagewise exposure environment is a balance of the features in the formation of well-structured fine raise printing features, such as highlight halftone dots and lines. That is, the present process provides the very fine highlight dots with sharply transitioning shoulders that are sufficiently strong to withstand the rigors of solvent processing.

As the oxygen concentration of the imagewise exposure environment was reduced, the shoulder angle on fine raised elements decreased, creating a broader shoulder transition from the top print surface to the side-wall surface. A broader shoulder is very susceptible to being printed and it is expected that faithful print reproduction would no longer be possible.

As the oxygen concentration of the imagewise exposure environment was increased, the shoulder angle became steeper but did not significantly change at oxygen concentration greater than or equal to 2%. However, increased oxygen concentration of the imagewise exposure environment also caused the fine highlight dots to become smaller than the corresponding opening of the mask (i.e., so-called, dot sharpening effect) and in one case the smallest dots were sharpened to the point of washing away. The smallest dots (i.e., 1% highlight dots) made at 4% oxygen concentration were not sufficiently polymerized and washed away during solvent processing.

The greyscale levels refer to particular dot percentages; and Greyscale level 1 had 0.39% dots, Greyscale level 2 had 0.78% dots, and Greyscale level 3 had 1.18% dots. At all oxygen concentrations of the exposure environment, Greyscale levels 1 and 2 were lost (i.e., washed away) after solvent processing. For the plates imagewise exposed in the environment having 3% and less oxygen concentrations (Plates 3A, 3B, 3C, 3D, 3E), only the dots of Greyscale level 3 held, that is, were retained after solvent processing. The plate exposed in the environment with 4% oxygen concentration (Plate 3F), Greyscale level 3 was lost after solvent processing, which indicated too much digital sharpening had occurred.

The invention claimed is:

1. A method for preparing a relief printing form from a photosensitive element, comprising the steps of:
    (a) forming an in-situ mask disposed above a layer of a photopolymerizable composition in the photosensitive element, wherein the photopolymerizable composition comprises a binder, an ethylenically unsaturated compound and a photoinitiator;
    (b) exposing the photopolymerizable layer to actinic radiation through the mask in an environment having an inert gas and a concentration of oxygen between 30,000 ppm and 7500 ppm, forming at least a polymerized portion and at least an unpolymerized portion; and,
    (c) treating by processing the element of step b) with at least one washout solution selected from organic solvent solution, aqueous solution, semi-aqueous solution, or water, whereby the unpolymerized portion is removed by the washout solution leaving a relief printing form having a plurality of raised surface elements made of the polymerized portion, with each raised surface element having a print surface area, and
    wherein the in-situ mask includes actinic radiation opaque areas and open areas, and in one or more of the open areas that produce image areas comprising halftone dot image areas and in one or more of the open areas that produce image areas comprising solid image areas, comprises a microcell pattern comprising a plurality of features in which each feature has dimension between 5 and 30 microns that is opaque to actinic radiation, and
    wherein after the removing step, the print surface area of one or more of the raised surface elements that form halftone dot image areas have the microcell pattern induced therein, and the print surface area of one or more of the raised surface elements that form the solid image areas have the microcell pattern induced therein.

2. The method of claim 1 wherein the washout solution is an organic solvent solution.

3. The method of claim 1 wherein the inert gas is selected from the group consisting of argon, helium, neon, krypton, xenon, nitrogen, carbon dioxide, and combinations thereof.

4. The method of claim 1 wherein a layer of an actinic radiation opaque material is disposed above the photopolymerizable layer, and step a) comprises imagewise exposing the actinic radiation opaque layer with laser radiation to form the in-situ mask.

5. The method of claim 4 wherein the imagewise exposing with laser radiation is selected from the group consisting of (a) selectively ablating the actinic radiation opaque layer from the photopolymerizable layer, and (b) selectively transferring portions of the actinic radiation opaque layer to the photopolymerizable layer.

6. The method of claim 1 further comprising, prior to step b), placing the photosensitive element in a chamber for the environment.

7. The method of claim 6 wherein the step of exposing the photopolymerizable layer begins when the concentration of oxygen in the chamber is between 30,000 ppm and 7500 ppm.

8. The method of claim 6 wherein the step of exposing the photopolymerizable layer begins when the concentration of oxygen in the chamber is less than or equal to 30,000 ppm and the concentration of oxygen is reduced during the exposing by introducing the inert gas into the chamber.

9. The method of claim 6 wherein the step of exposing the photopolymerizable layer begins when the concentration of oxygen in the chamber is between 30,000 ppm and 7500 ppm and the concentration of oxygen is maintained for the exposing by introducing the inert gas and oxygen into the chamber.

10. The method of claim 6 wherein the step of exposing the photopolymerizable layer occurs for a total exposure time, and during said exposure the concentration of oxygen is a weighted average of the oxygen concentration based on the percentage of time at a particular oxygen concentration.

11. The method of claim 1 wherein the environment comprises nitrogen as the inert gas and the concentration of oxygen is 30,000 ppm to 7500 ppm.

12. The method of claim 1 wherein the environment comprises nitrogen as the inert gas and the concentration of oxygen is 25,000 ppm to 7500 ppm.

13. The method of claim 1 wherein the environment comprises nitrogen as the inert gas and the concentration of oxygen is 20,000 ppm to 7500 ppm.

14. The method of claim 1 wherein after step c) the element is a relief printing form having a pattern of printing areas, and the method further comprises:
   d) securing the printing form onto or adjacent a print cylinder;
   e) applying an ink to the printing areas of the printing form; and
   f) contacting the ink from the printing areas to a substrate, thereby transferring the pattern of ink onto the substrate.

15. The method of claim 14, wherein the ink is a solvent ink and the substrate is a polymeric film.

* * * * *